United States Patent
Bock et al.

[19]

[11] Patent Number: 5,953,418
[45] Date of Patent: Sep. 14, 1999

[54] PROVIDING SELECTIVE DATA BROADCAST RECEIVER ADDRESSABILITY

[75] Inventors: James M. Bock, New Boston, N.H.; Marian Tapu, Lakewood, Ohio

[73] Assignees: David Hall; Patricia Gallup, Gilsum, N.H.

[21] Appl. No.: 08/664,963

[22] Filed: Jun. 14, 1996

Related U.S. Application Data

[60] Provisional application No. 60/000,223, Jun. 14, 1995, provisional application No. 60/000,240, Jun. 15, 1995, provisional application No. 60/000,241, Jun. 15, 1995, and provisional application No. 60/000,248, Jun. 15, 1995.

[51] Int. Cl.$^6$ ............................... H04L 9/00; H04L 9/06; H04N 7/167

[52] U.S. Cl. ......................... 380/20; 380/6; 380/7; 380/9; 380/10; 380/23; 380/25; 380/29; 380/49; 380/50; 455/3.1; 455/5.1; 455/6.1; 455/6.2; 455/6.3; 348/6; 348/9; 348/12; 370/522; 370/527

[58] Field of Search ............................... 380/4, 9, 10, 20, 380/23, 25, 49, 50, 59, 29, 21, 6, 7; 348/6, 9, 10, 11, 12; 455/3.1, 5.1, 6.1, 6.2, 6.3

[56] References Cited

U.S. PATENT DOCUMENTS

| | | |
|---|---|---|
| 3,743,767 | 7/1973 | Bitzer et al. . |
| 3,984,624 | 10/1976 | Waggener . |
| 3,993,861 | 11/1976 | Baer . |
| 4,034,405 | 7/1977 | Janssen . |
| 4,186,413 | 1/1980 | Mortimer . |
| 4,303,941 | 12/1981 | Marti et al. . |
| 4,367,548 | 1/1983 | Cotton, Jr. et al. . |
| 4,367,557 | 1/1983 | Stern et al. . |
| 4,368,486 | 1/1983 | Degoulet et al. . |
| 4,374,399 | 2/1983 | Ensinger . |
| 4,380,027 | 4/1983 | Leventer et al. . |
| 4,395,780 | 7/1983 | Gohm et al. . |
| 4,413,281 | 11/1983 | Thonnart . |

(List continued on next page.)

FOREIGN PATENT DOCUMENTS

| | | |
|---|---|---|
| 1215772 | 12/1986 | Canada . |
| 0 150 412 A2 | 1/1984 | European Pat. Off. . |
| 0 200 310 A2 | 11/1986 | European Pat. Off. . |
| 0 454 364 A2 | 4/1991 | European Pat. Off. . |
| 0 609 936 A2 | 1/1994 | European Pat. Off. . |
| WO 94/19909 | 9/1994 | WIPO . |
| WO 95/01020 | 1/1995 | WIPO . |

OTHER PUBLICATIONS

Patent Abstracts of Japan, vol. 16, No. 185, Publication No. JP 04 022240, Publication date Jan. 1992, Inventor Sato Shinichi.

PCT International Search Report for PCT/US 96/10419, dated Feb. 6, 1997 (English language version).

Crosstalk XVI (Software Manual), 1984, Sections 12.0–12.4 pp. 92–95.

"CMOS Asynchronous FIFO", *Military and Commercial Temperature Ranges*, Dec. 1995, pp. 1–14.

Conard, James W., "Services and Protocols of the Data Link Layer" *Proceedings of the IEEE*, vol. 71, No. 12, Dec. 1983, pp. 1378–1383.

"Data Encryption Standard" Federal Information Processing Standards Publication 46–1 Reaffirmed, Jan. 22, 1988, pp. 1–15.

Tannenbaum, Andrew S., "Network Protocols", *Computing Surveys*, vol. 13, No. 4, Dec. 1981, pp. 453–489.

Rosenberg, R., "Think There's Nothing New On T.V.?", *The Boston Globe*, Jun. 21, 1995, pp. 44–45.

*Primary Examiner*—Bernarr E. Gregory
*Attorney, Agent, or Firm*—Foley, Hoag & Eliot LLP

[57] ABSTRACT

A method of transmitting data to a plurality of receivers is provided wherein an identifier is assigned to each of the receivers that cannot be ascertained once assigned, a subset of receivers is selected to receive data, and an encrypted board identifier corresponding to each receiver of the subset is transmitted, wherein a receiver of the subset becomes enabled upon receipt of the encrypted board identifier and data is transmitted with an indication that the data is only for receivers that have been enabled.

28 Claims, 18 Drawing Sheets

U.S. PATENT DOCUMENTS

| | | |
|---|---|---|
| 4,425,581 | 1/1984 | Schweppe et al. . |
| 4,496,975 | 1/1985 | Noirel . |
| 4,530,048 | 7/1985 | Proper . |
| 4,593,374 | 6/1986 | Gurumurthy . |
| 4,599,644 | 7/1986 | Fischer . |
| 4,630,231 | 12/1986 | Hirata et al. . |
| 4,695,880 | 9/1987 | Johnson et al. . |
| 4,734,764 | 3/1988 | Pocock et al. . |
| 4,807,031 | 2/1989 | Broughton et al. . |
| 4,829,569 | 5/1989 | Seth-Smith et al. . |
| 4,875,096 | 10/1989 | Baer et al. . |
| 4,876,698 | 10/1989 | Boisson et al. . |
| 4,894,789 | 1/1990 | Yee . |
| 4,908,828 | 3/1990 | Tikalsky ................. 371/69.1 |
| 4,920,503 | 4/1990 | Cook . |
| 4,937,866 | 6/1990 | Crowther et al. ......................... 380/20 |
| 4,995,080 | 2/1991 | Bestler et al. ............................ 380/21 |
| 5,010,499 | 4/1991 | Yee . |
| 5,121,476 | 6/1992 | Yee . |
| 5,251,301 | 10/1993 | Cook . |
| 5,278,647 | 1/1994 | Hingorani et al. . |
| 5,404,404 | 4/1995 | Novorita . |
| 5,453,794 | 9/1995 | Ezaki ..................... 348/461 |
| 5,502,493 | 3/1996 | Meyer ..................... 348/426 |
| 5,554,968 | 9/1996 | Lee . |

BIT POSITION

| 3 | 2 | 1 | 0 | EXPLANATION |
|---|---|---|---|---|
| 0 | X | X | X | PUBLIC PACKET |
| 1 | X | X | X | PRIVATE PACKET |
| X | X | 0 | 0 | NORMAL DATA PACKET |
| X | X | 0 | 1 | BOARD ID PACKET |

PMODE VALVE TABLE — 240

Fig. 14

CONFIGURATION DATA — 250

| POSITION | NAME | DESCRIPTION |
|---|---|---|
| 0 | PACKET ID | ALWAYS FFh. |
| 1 | FUNCTION ID | ALWAYS 3. |
| 2-3 | CONTROL SEQUENCE NUMBER | SEQUENCE NUMBER OF THIS CONTROL PACKET. VALUES RANGE FROM 1-FFFFh. |
| 4 | CONTROL CHECK SUM | USED TO VERIFY THAT THIS IS A CONTROL PACKET. |
| 5 | VERSION NUMBER | IDENTIFIES SPECIFIC FORMAT OF THIS PACKET SO CAN MODIFY OR ADD FIELDS LATER. CURRENTLY 0. |
| 6-7 | DISK DELAY * | NUMBER OF MILLISECONDS TO DELAY BETWEEN TRANSMITTING DIFFERENT FILE BUFFERS. |
| 8-9 | START LINE * | FIRST VIDEO LINE WITH DATA. |
| 10 | BITS PER LINE | NUMBER OF BITS PER VIDEO LINE. |
| 11 | LINE COUNT | TOTAL NUMBER OF VIDEO LINES. |
| 12 | START POSITION | WHERE DATA BEGINS ON VIDEO LINE. |
| 13 | BIT WIDTH | 0=250ns, 1=375ns, 2=500ns, 3=750ns |
| 14 | BYTES PER PACKET | TOTAL BYTES PER PACKET. |
| 15 | PACKETS PER FIELD | NUMBER OF PACKETS PER FIELD. IF ZERO THEN THE TRANSMITTER SOFTWARE TRANSMITS AS MANY PACKETS HARDWARE WILL ALLOW, CROSSING FIELD BOUNDARIES. |
| 16 | BUFFER COUNT | NUMBER OF TIMES TO TRANSMIT EACH 64K BUFFER DURING FILE TRANSFER. |
| 17 | REDUNDANCY MODE | ALWAYS 1. |
| 18 | HARDWARE REDUNDANCY COUNT | NUMBER OF TIMES FOR HARDWARE TO REPEAT TRANSMITTING A PACKET. |
| 19 | SOFTWARE REDUNDANCY COUNT | NUMBER OF TIMES FOR SOFTWARE TO REPEAT TRANSMITTING A PACKET. |
| 20 | ECC MODE | 0=OFF, 1=IFEC, 2=29/24 |
| 21 | CRC MODE | 0=16-BIT, 1=32-BIT |
| 22 | REMOTE SYSTEM | 0=PC, 1=OMNI |
| 23 | CONFIGURATION CHECK SUM | HELP VALIDATES THE CONTENTS OF THIS PACKET. |

Fig. 15

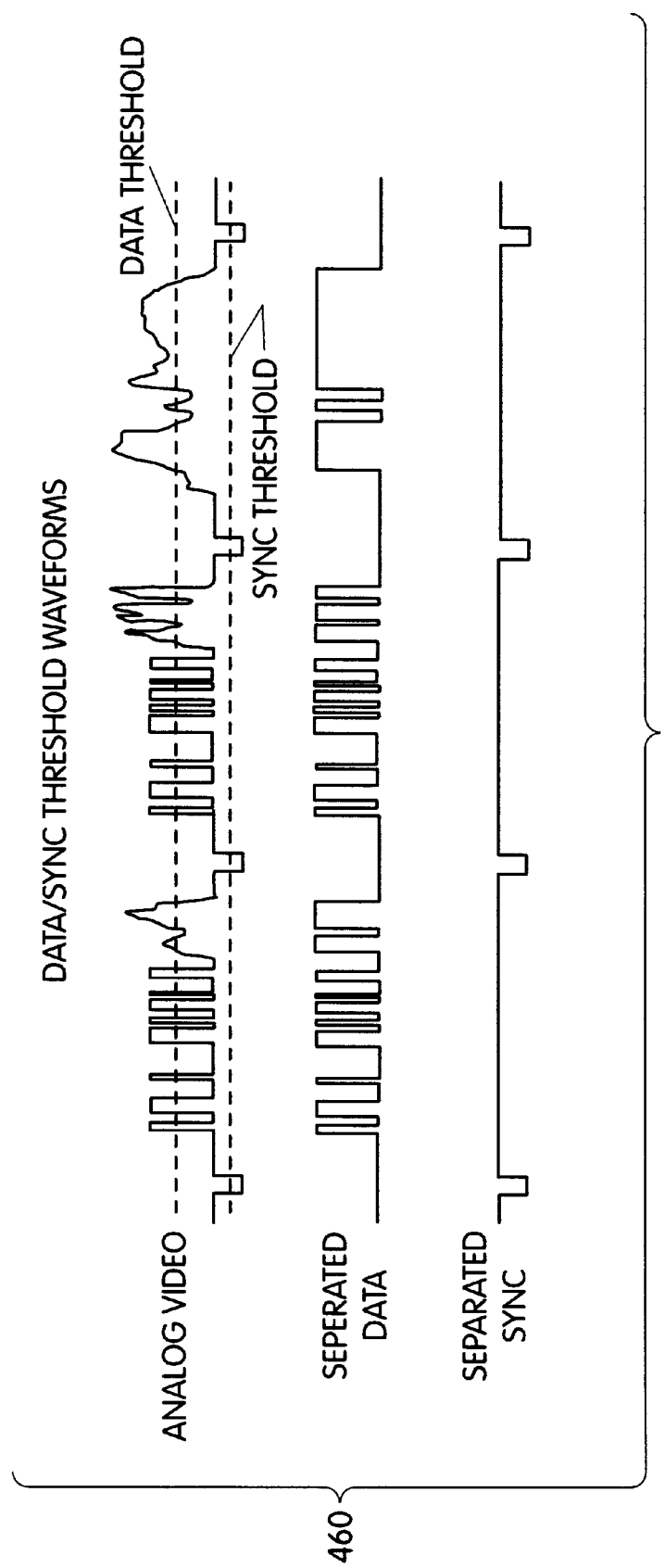

PROVIDING SELECTIVE DATA BROADCAST RECEIVER ADDRESSABILITY

This application claims the benefit of U.S. provisional patent applications 60/000233, 60/000240, 60/000241, and 60/000248 filed on Jun. 15, 1995 and claims the benefit of U.S. provisional patent applications 60/018160 and 60/017704 filed on May 23, 1996.

TECHNICAL FIELD

This application relates to the field of video communication and more particularly to the field of using a video communication signal to transmit and receive other data.

BACKGROUND OF THE INVENTION

It is known that a digital data signal can be superimposed onto a video signal in such a way so as not to significantly impair conventional reception of the video signal by conventional video signal receivers. The resulting combined signal can be transmitted both to conventional video signal receivers and to specially configured receivers capable of extracting the digital data signal from the video signal. A user with a conventional video signal receiver may, in certain instances, notice some picture degradation in the form of a section of the visible video picture being "snow", but otherwise, the video signal produces a viewable picture. Such a system is described in U.S. Pat. Nos. 4,920,503 and 5,251,301, both to Cook.

There are some drawbacks to combining a digital data signal with a video signal in this manner. For example, in a conventional video transmission system, such as a television broadcast station, there are many recipients of the data. Therefore, it may be impractical to allow the recipients to provide data back to the transmitter indicating, for example, the configuration of the receiver and/or non-receipt of certain portions of the data. For all practical purposes, the communication in such a system is one-way from the transmitter to the plurality of receivers.

In addition, in a conventional communication system, the transmitter can retransmit the communication signal upon receipt of an indication that one or more of the receivers did not properly receive the data that was sent. In the case of a video transmission system, however, this may be impractical, especially where the transmitter is a conventional television station and many of the recipients are receiving and using the conventional video signal portion of the transmitted signal in order to view the picture and audio transmitted therewith in a conventional manner. Such users, who may not be interested in the digital data being superimposed onto the video signal, would probably not appreciate having the same video signal retransmitted numerous times at the request of some of the receivers.

SUMMARY OF THE INVENTION

According to the present invention, transmitting data to a plurality of receivers includes assigning a board ID to each of the receivers where, once assigned, the board ID cannot be ascertained, selecting a subset of receivers to receive the data, transmitting an encrypted board ID corresponding to each receiver of the subset, where a receiver of the subset becomes enabled upon receipt of a corresponding encrypted board ID, and transmitting the data with an indication that the data is only for receivers that have been enabled, where each of the receivers that is enabled receives the data. The data may be encrypted before transmission.

The board ID's and the data may be encrypted using different encryption techniques. For example, the data may be encrypted using a DES encryption technique. The board ID may be encrypted using an ECB DES encryption technique. Assigning a board ID may include assigning a unique board ID to each of the receivers. Optionally, only the receivers that are enabled may receive the data and/or a board ID that has been assigned may not be modified. Data may be transmitted in packets and more than one board ID may be transmitted in a single packet. Data may be transmitted by being superimposed onto a video signal.

BRIEF DESCRIPTION OF DRAWINGS

FIG. 14 is a table showing bit positions and settings for various values of a portion of a packet header used to send packet data.

FIG. 15 is a table showing exemplary configuration data.

FIG. 22 is a graph illustrating extracting sync and data information from a received video signal that has digital data superimposed thereon.

DETAILED DESCRIPTION OF THE PREFERRED EMBODIMENTS

Figure 1:
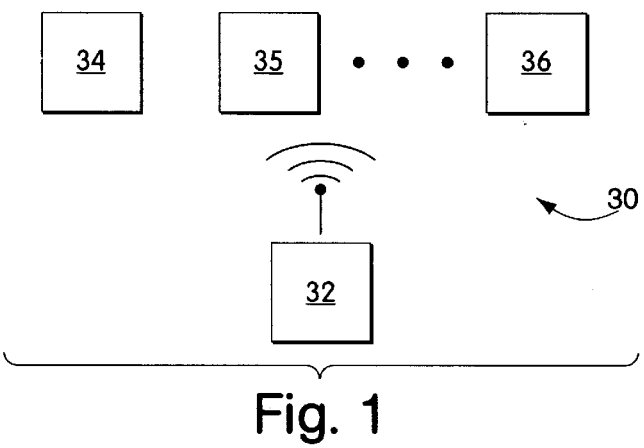
FIG. 1 is a block diagram of a communication system according to the present invention.

Referring to FIG. 1, a communication system 30 includes a data transmitter 32 that broadcasts data to a plurality of data receivers 34–36. Although only three boxes are used for illustrative purposes in FIG. 1 to represent the receivers 34–36, the system 30 can have any number of receivers 34–36.

The data transmitter 32 can be one or more conventional computers/computer systems, one or more conventional sources of video data, or some combination thereof. Similarly, each of the data receivers 34–36 can be one or more computer systems, video receivers, or some combination thereof. The transmission medium between the transmitter 32 and the receivers 34–36 may be any one or more conventional means suitable for transmitting video and/or computer data including, but not limited to, over the air, coaxial copper cable, or fiber optics. Similarly, the transmissions may be radio frequency electromagnetic waves, microwaves, light signals, or any other suitable transmission means.

The data that is transmitted from the transmitter 32 to the receivers 34–36 can be in analog format, digital format, or some combination thereof. In the case of analog data, it is possible for one or more of the receivers 34–36 to digitize the analog data upon receipt. Conversely, in the case of a digital transmission, it is possible for one or more of the receivers 34–36 to convert the data to an analog signal upon receipt.

In certain configurations, the communication system 30 includes a single entity as a source of data for the transmitter 32 and a finite number of data receivers 34–36. Such a configuration would occur, for example, in a video conferencing system where there are a finite number of participants and one of the participants is transmitting data (e.g., video and audio) to the other ones of the participants. In addition, it is possible in such situations for different ones of the participants to become a source of data when, for example, a first participant provides video and audio data and then another one of the participants responds and so provides his own video and audio data.

In other configurations, it is possible for the transmitter 32 to provide data to a relatively large number of receivers 34–36 where particular ones of the receivers 34–36 go on-line and off-line periodically and randomly during the transmission, thus continuously changing the number and specific identities of the receivers 34–36. This occurs, for example, in connection with a conventional television signal broadcast where a single broadcaster, such as a conventional television station, provides information to a relatively large and ever changing number of recipients. This type of communication is often unidirectional since it may be impractical to allow any one of the receivers 34–36 to send any information back to the transmitter 32.

In a preferred embodiment, communication between the transmitter 32 and receivers 34–36 is provided by an analog video signal having a digital data signal superimposed thereon. Similar systems are known in the prior art and described, for example, in U.S. Pat. Nos. 4,920,503 and 5,252,301, both to Cook. In those patents, a portion of the analog video signal is used to transmit digital data that has been first converted to a corresponding analog signal.

Figure 2:
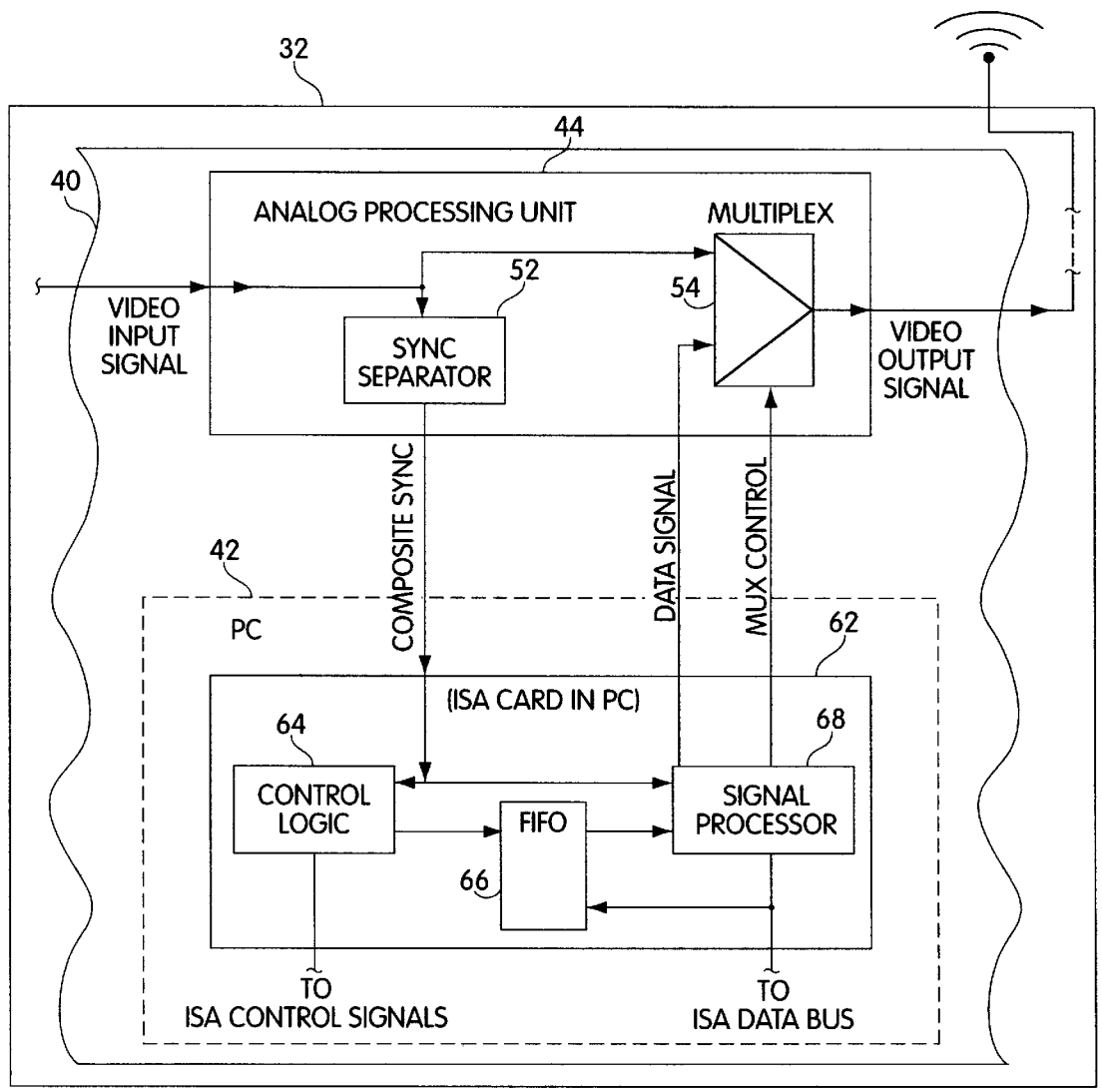
FIG. 2 is a schematic block diagram of a transmitter according to the present invention.

Referring to FIG. 2, a portion 40 of the transmitter 32 is shown in schematic block diagram format. The portion 40 includes a PC 42 and an analog processing unit 44. The PC 42 generates digital data in a conventional manner and processes the data as described in detail below. The analog processing unit 44 processes the video signal and combines the data and video signals as described in detail below.

The portion 40 of the transmitter 32 is provided with a conventional NTSC analog video signal from a video data source. The video signal can be from any conventional source of video including, but not limited to, a broadcast television station, a video camera, a VCR, or a computer capable of generating NTSC video signals. The following discussion is directed to use of an analog video signal formatted according to the conventional NTSC video, although it will be apparent to one of ordinary skill in the art that the system disclosed herein could be adapted for use with the PAL or SECAM video format or with other types of video signals. The digital data can be from any conventional digital data source including, but not limited to, a computer, a digital data line, a readout from a digital CD-ROM, or a floppy disk or a conventional computer hard disk.

In a preferred embodiment, the NTSC video signal is a broadcast television station video signal and the digital data is a conventional computer file or other source of digital data. The particular data signal that is provided may be such that it conforms with the subject matter that is being broadcast on the video signal so that, for instance, the information being provided via the digital data can include information about a particular sports team when the video signal corresponds to a sporting event featuring that team. In certain embodiments, described in detail hereinafter, it is possible for the PC 42 to generate the entirety of the output NTSC video signal rather than generating only a signal that is combined with an existing video signal.

The PC 42 is connected to the analog processing unit 44 by any one of a variety of conventional techniques familiar to one of ordinary skill in the art for providing electrical signal connections, such as a shielded, twisted pair cable. The PC 42 receives a COMPOSITE SYNC signal from the analog processing unit 44 and provides a DATA signal and a MUX CONTROL signal to the analog processing unit 44. Note that, although in this embodiment the analog processing unit 44 is shown as being separate from the PC 42, it is straightforward for one of ordinary skill in the art to combine the analog processing unit 44 and the PC 42 to provide functionality equivalent to that of the analog processing unit 44 as part of the PC 42.

The analog processing unit 44 includes a sync separator 52 which is coupled to a VIDEO INPUT signal. The sync separator 52 removes all information from the VIDEO INPUT signal, except for the sync portions of the signal, to provide as output a composite sync signal. Techniques and mechanisms for extracting a sync portion of a video signal in this manner are known. The sync separator 52 may be implemented by any one of a variety of conventional means, known to one of ordinary skill in the art, for providing a composite sync signal in response to a conventional video signal. The analog processing unit 44 also includes a multiplex 54 which is coupled to the VIDEO INPUT signal at one of the inputs of the multiplex 54. The other inputs to the multiplex 54 are the DATA signal from the PC 42 and a mux control signal from the PC 42, both of which are described in more detail hereinafter.

The PC 42 includes a conventional ISA computer bus interface card 62 that is plugged into one of the conventional computer slots of the PC 42. As described in more detail below, the ISA card 62 contains the circuitry for handling the digital data that is provided by the PC 42. The ISA card 62 comprises conventional ISA control logic 64, a conventional FIFO 66 and a signal processor 68. The control logic 64 handles controlling communications between the PC 42 and the ISA card 62 in a conventional manner known to one of ordinary skill in the art. The control logic 64 is connected to the ISA control bus in a conventional manner.

The FIFO 66 is connected to the control logic 64 and to the signal processor 68. The FIFO 66 is used to store data that is provided by the PC 42 to the ISA card 62 via the ISA data bus. Since the signal processor 68 may only be able to handle data provided at a certain rate that is less than the burst rate that the PC 42 can provide data to the ISA card 62, the FIFO 66 is used to buffer the input data provided by the PC 42 and provide that data to the signal processor 68 at a rate that the signal processor 68 can handle. The FIFO 66 is controlled by the control logic 64 in a conventional manner to receive and store the data that comes via the ISA bus.

In a preferred embodiment, the data to be transmitted is provided by the PC 42 to the FIFO 66 immediately after the vertical sync pulse of the VIDEO INPUT signal, preferably during a portion of the VIDEO INPUT signal corresponding to the first nine lines of video information. Since no data is superimposed onto the video signal during the first nine lines, this has the effect of writing data to the FIFO 66 at a time when the signal processor 68 will not be reading data. The timing is provided by coupling the COMPOSITE SYNC signal to the control logic 64 and having the control logic 64 issue an interrupt request to the PC 42 via the ISA control signals coupled to the control logic 64. A conventional mechanism for timing the interrupt request in this manner is straightforward to one of ordinary skill in the art.

The signal processor 68 receives data from the FIFO 66 and, in addition, sends and receives data to and from the ISA bus in a conventional manner. The nature of the data that is sent and received by the signal processor 68 to and from the ISA data bus will become apparent in light of the detailed description contained herein.

The signal processor 68 uses the COMPOSITE SYNC signal from the sync separator 52 to process the data from the FIFO 66 and provide a signal to the multiplex 54 that corresponds to the data from the FIFO 66. The DATA signal that is provided by the signal processor 68 is a digital signal that is timed so as to appear in very specific portions of the VIDEO INPUT signal, as described in detail below. The signal processor 68 also outputs a MUX CONTROL signal to the multiplex 54. The MUX CONTROL signal selects which of the two input signals to the multiplex 54, the DATA signal or the VIDEO INPUT signal, will be provided at the output of the multiplex 54. In a manner described in more detail hereinafter, the MUX CONTROL signal switches between the VIDEO INPUT signal and the DATA signal to superimpose the DATA signal on predetermined portions of the VIDEO INPUT signal such that a VIDEO OUTPUT signal from the multiplex 54 is a combination of the VIDEO INPUT signal and the DATA signal. The VIDEO OUTPUT signal is provided to a conventional transmission portion (not shown) of the transmitter 32 for broadcasting to the receivers 34–36. The VIDEO OUTPUT signal may be transmitted by any one of a variety of conventional transmission mechanisms known to one of ordinary skill in the art.

Figure 3:
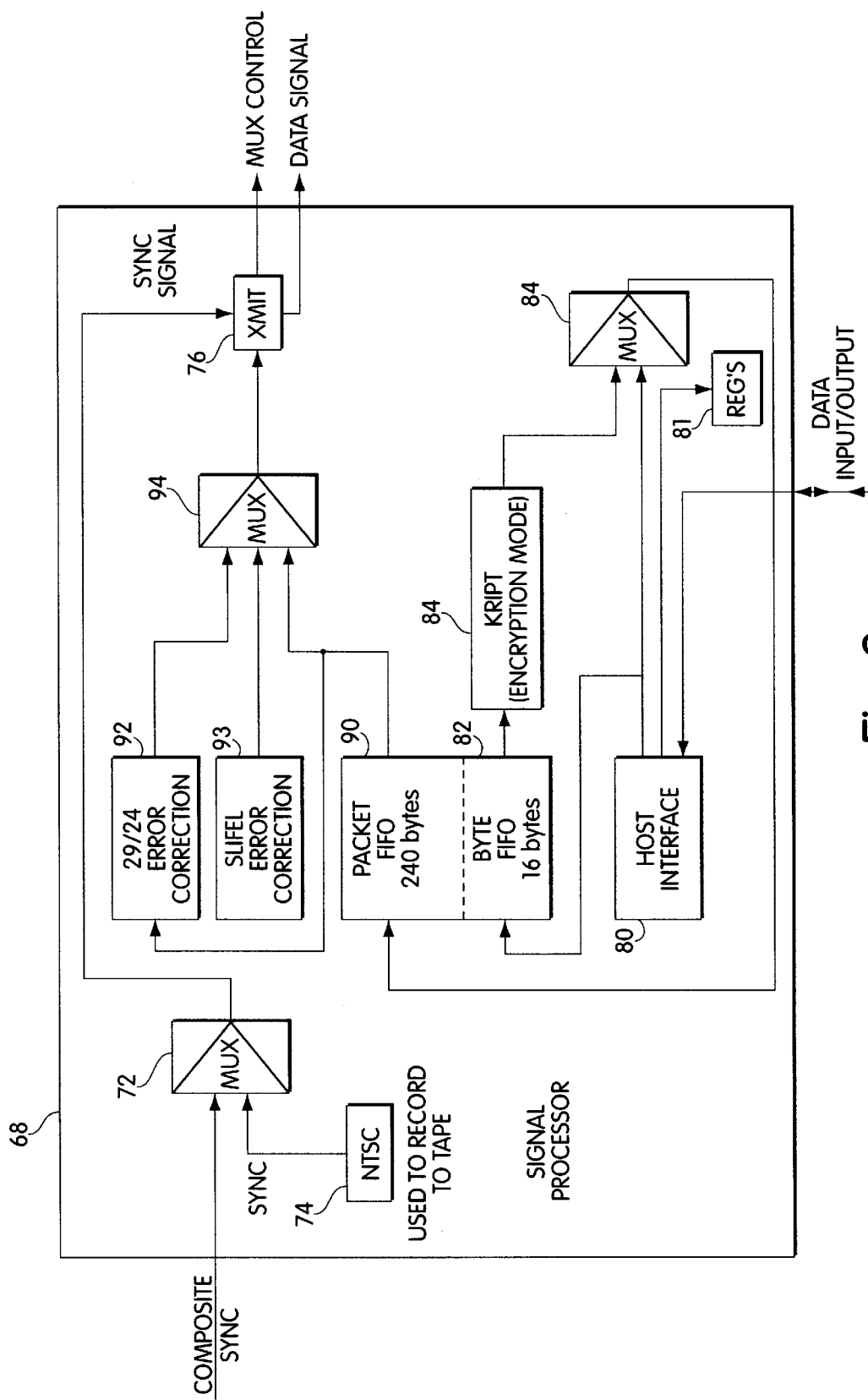
FIG. 3 is a schematic block diagram of a signal processor for a transmitter.

Referring to FIG. 3, the signal processor 68 is illustrated in block diagram format. The signal processor 68 may be implemented using a single custom integrated chip, such as an ASIC, constructed in a conventional manner known to one of ordinary skill in the art. In a preferred embodiment, cost effectiveness is achieved by using the same ASIC chip for the transmitter signal processor 68 and to handle signal processing in connection with the receivers 34–36. Signal processing for the receivers 34–36 is described elsewhere herein. Alternatively, it is possible, based on the description provided herein, to implement the signal processor 68 as specific discrete components.

The signal processor 68 is illustrated in FIG. 3 as having a single data input/output rather than separate inputs for the ISA data bus and the FIFO 66, as shown in FIG. 2. Note that the signal processor 68 can interface with the PC 42 in a variety of conventional manners using a variety of communication formats/protocols and any one of a variety of conventions for communication into and out of the signal processor 68. Accordingly, for the description which follows, it is not necessary to describe the aspects of the signal processor 68 that relate to implementation on the ISA card 62 in the PC 42, as illustrated in FIG. 2. Accordingly, the following discussion of the signal processor 68 will focus on functionality and implementation of the signal processor 68 without specific regard to communication of data between the PC 42 and the signal processor 68.

The signal processor 68 includes a mux 72 which is provided with the COMPOSITE SYNC signal from the analog processing unit 44 shown in FIG. 2. The signal processor 68 also includes a sync signal generator 74 that generates an NTSC video sync signal that is provided at another input to the mux 72. The mux 72 outputs either the COMPOSITE SYNC signal or the sync signal from the sync signal generator 74, the choice of which depends upon actuation of a control input (not shown) to the mux 72 that is controlled by conventional logic (not shown) to handle the case where the signal processor 68 is used in a mode in which no input video signal is provided and hence no COMPOSITE SYNC signal is available. This occurs in applications where the data from the PC 42 is provided directly to a video device without being superimposed upon or combined with a video signal. For example, it is possible to copy data from the PC 42 directly onto a video tape in order to back up a hard drive to the video tape. In that case, the output signal is provided without superimposing the DATA signal onto a video signal and the mux 72 would be switched so that the sync signal is provided by the sync signal generator 74.

The output of the mux 72 is provided to an XMIT unit 76, which generates both the DATA signal and the MUX CONTROL signal discussed above in connection with FIG. 2. The XMIT unit 76 is described in more detail hereinafter.

The signal processor 68 also includes a host interface 80 which handles data communication into and out of the signal processor 68. The host interface 80 handles this data communication in a conventional manner. Implementation of specific circuitry for the host interface 80 is either or both readily available using off-the-shelf components and/or is straightforward to implement for one of ordinary skill in the art. Note that if the signal processor 68 is not being used in connection with the ISA card 62 connected to an ISA bus of a PC 42 as illustrated herein, then the host interface 80 would handle data communication for the signal processor 68 in a different, but no less straightforward, manner. For example, it is possible to use the signal processor 68 in connection with an SCSI port of a computer. In that case, the host interface 80 would handle communication for the signal processor 68 via and through the SCSI port.

Some of the data provided to the signal processor 68 by the PC 42 is used to control the signal processor 68. This data is not transmitted but, instead, is used to change values of one or more of a plurality of registers 81. The registers 81 provide operational values to different components of the signal processor via hard-wire connections (not shown). A detailed description of the registers 81 and how the registers 81 are used is set forth elsewhere herein. The host interface 80 differentiates between data to be transmitted and register or other control information in a conventional manner, such as using specific values of data to indicate that a predetermined amount of data that follows is register information.

The data output of the host interface 80 is coupled to a byte FIFO 82, which is a conventional first-in/first-out memory that, in the embodiment illustrated herein, stores sixteen bytes of data. The output of the byte FIFO 82 is provided to a krypt unit 84 that encrypts sixteen bytes at a time of data from the byte FIFO 82 using any one of three conventional DES encryption algorithms: the ECB DES algorithm, the OFB DES algorithm, or the CFB DES algorithm.

The output of the krypt unit 84 is provided to a mux 86. The other input to the mux 86 is unencrypted data directly from the host interface 80. A control signal (not shown) that varies according to encryption selection information stored in the registers 81, provides a signal to the mux 86 to determine whether the output of the mux 86 will be the encrypted data from the krypt unit 84 or the unencrypted data directly from the host interface 80. Instances where it may be desirable to transmit encrypted data rather than unencrypted data, or vice versa, are set forth below.

The output of the mux 86 is provided to a packet FIFO 90. The packet FIFO 90 stores packets of data in a first-in/first-out basis so that data can be removed from the packet FIFO 90 an entire packet at a time. The output of the packet FIFO 90 is provided to a 29/24 error correction unit 92 and a SLIFEC error correction unit 93. The error correction units 92, 93 supplement the data with error correction information that can be used by the receiver to correct transmission errors. The 29/24 error correction unit 92 provides 29/24 error correction (also referred to as shortened cyclic code error correction). The SLIFEC error correction unit 93 employs scan line interleaved forward error correction ("SLIFEC"), which is described in more detail hereinafter.

The 29/24 error correction coding is implemented by modifying a standard 31/26 hamming cyclic code so that an integral number of bytes are encoded. The code is shortened to a code with twenty-four message bits. For correction, five error correction bits are appended to the data. The algorithm derived for the desired 29/24 code is $p(x)=x^4+x^2$ and is implemented in hardware, via a linear feedback shift register, in a conventional manner. Furthermore, since the data is a live uninterruptable stream, the linear feedback shift register, which normally requires a non-zero latency (set-up down time on transmit and receive sites), a further modification is made to overcome this shortcoming. Two identical linear feedback shift registers are implemented in parallel and control passes from one to the other as successive three-byte groups of data are processed.

The outputs from the error correction units 92, 93 are provided as data inputs to a mux 94. Another input to the mux 94 is the output of the packet FIFO 90. It is possible to transmit data without any error correction information appended thereto where, for example, the transmission channel is relatively noise-free and maximum data throughput is desired. Accordingly, the mux 94 provides a mechanism for bypassing the error correction units 92, 93. Conventional control logic (not shown) controls the mux 94 to select either the input from the packet FIFO 90 or the input from one of the error correction units 92, 93 to be provided at the output of the mux 94. The output of the mux 94, along with the sync signal from the mux 72 is provided to the XMIT unit 76 which provides the DATA signal and MUX CONTROL described above in connection with FIG. 2.

Figure 4:
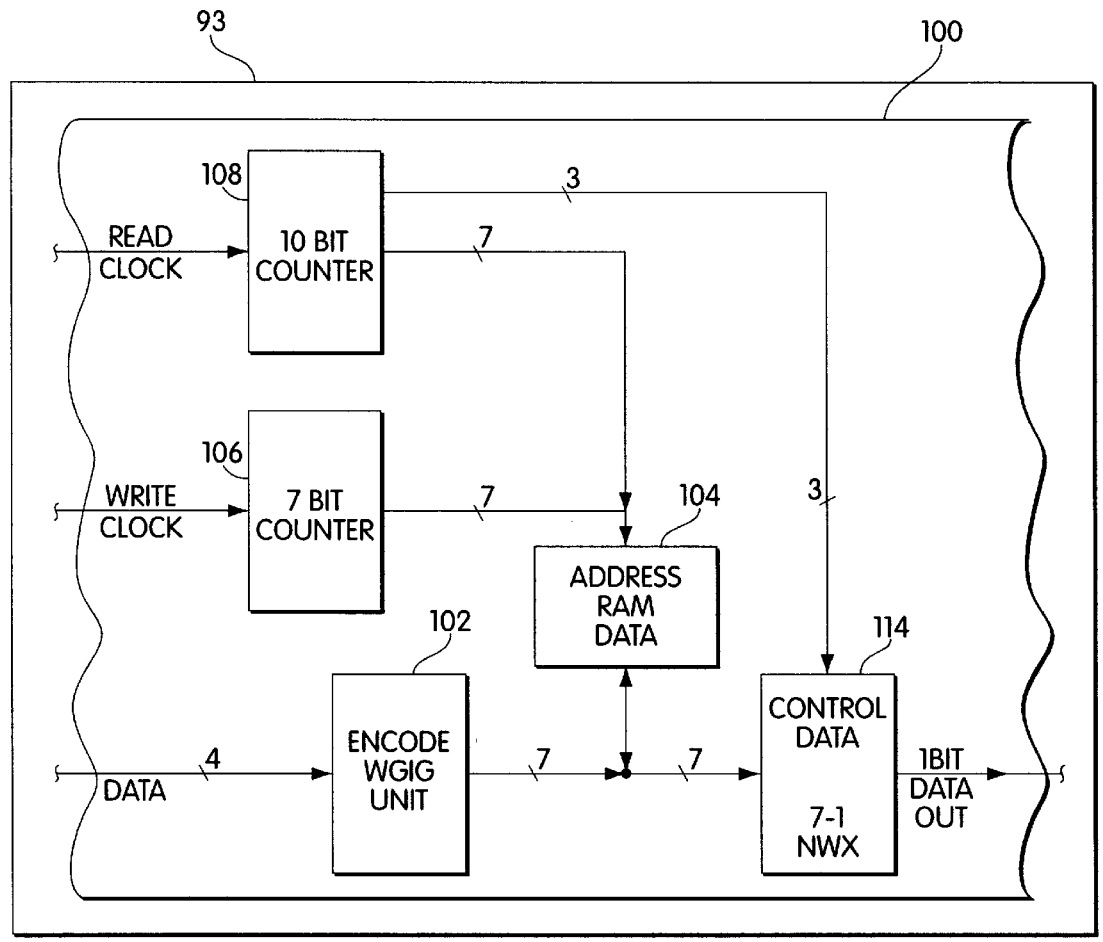
FIG. 4 is a schematic block diagram of a portion of an error correction unit of a transmitter.

Referring to FIG. 4, a portion 100 of the SLIFEC error correction unit 93 is shown in schematic block diagram format. As discussed above in connection with FIG. 3, the 29/24 error correction unit 92 employs an alternative error correction scheme, described above. As discussed above in connection with FIG. 3, the error correction technique used is programmable and selectable via the mux 94 such that the transmission data can have no error correction, 29/24 error correction, or SLIFEC error correction.

The output from the packet FIFO 90 is provided, a nibble at a time, to an encode logic unit 102 which encodes the nibble using the well-known (7,4) cyclic coding technique to provide a seven-bit output. The (7,4) cyclic code, and implementation thereof by one of ordinary skill in the art using, for example, a look-up table or a conventional linear feedback shift register circuit, is straightforward and therefore, the encode logic unit 102 is not discussed further herein. A RAM 104 having seven data bits and seven address bits is used to store the output of the encode logic unit 102. For the store operation, the RAM 104 is addressed by the output of a seven-bit counter 106 that is incremented each time the seven-bit counter 106 receives a WRITE CLOCK signal. Using conventional logic timing means, the WRITE CLOCK signal is asserted once for each nibble provided to the encode logic unit 102 based on the availability of data and the amount of space remaining in the RAM 104. Since the seven-bit counter 106 is incremented for each nibble provided to the encode logic unit 102, then each output of the encode logic 102 is stored in a successive address in the RAM 104.

The error correction scheme employed by the encode logic unit 102 is sufficient for correcting a single bit (or sometimes a two bit) error in transmission of a nibble so encoded. That is, a seven-bit data signal representing a nibble encoded by the encode logic unit 102 can be restored to the original nibble even if one (or sometimes two) of the bits of the seven-bit signal are lost or garbled during transmission and/or upon receipt. However, in the case of video transmission, the errors are often "bursty", meaning that an error in one bit substantially increases the likelihood of errors being present in adjacent bits. Therefore, it is possible for a significant portion or perhaps even the entirety of a seven-bit signal that is transmitted to be lost or garbled by a bursty error. In that case, the seven-bit encoded signal cannot be restored to the original nibble.

While the burst errors that are present in the case of video transmission cause adjacent bits to be lost or garbled during transmission, the average error rate for a video transmission system can still be quite low. Therefore, if the bits for each seven-bit value written to the RAM 104 are transmitted at different times, then the chance that more than one of the bits of a particular seven-bit value have been corrupted are quite low, especially when compared to the likelihood that more than one of the bits is corrupted if all seven bits are transmitted together at nearly the same time.

A READ CLOCK signal is asserted by conventional means once for each bit to be read out of the RAM 104. The READ CLOCK signal is provided to a ten-bit counter 108 and increments the output of the ten-bit counter 108 once for each time that the READ CLOCK signal is asserted. The seven least significant bits of the output of the ten-bit counter 108 are used to address the RAM 104 in order to access the seven-bit data stored in the RAM 104. The seven-bit output data of the RAM 104 is provided as a data input to a seven-to-one mux 114. A three-bit control input to the mux 114 determines which of the seven bits will be provided as the one-bit data output of the mux 114. The three control bits of the mux 114 are connected to the three most significant bits of the output of the ten-bit counter 108. In this way, the output of the mux 114 corresponds to one bit position at a time for each of the seven-bit data values stored in the RAM 104. That is, the output of the mux 114 is a string of bits corresponding to the zeroth bit of each of the seven-bit data values stored in the RAM 104 followed by the first bit of all of the seven-bit data values stored in the RAM 104, et cetera. In this way, the SLIFEC error correction "spreads out" the bits of each of the seven-bit data value stored in the RAM 104 so that a bursty transmission error is much more likely to only affect a single bit of each of the seven-bit values in the RAM 104. For example, even if a burst error garbles fifty sequential bits in the transmission, fifty of the seven-bit values in the RAM 104 will have a single bit error which can be corrected at the receiver. Note that the single bit output of the mux 114 can be provided to a serial-to-parallel converter (not shown) that provides the output of the SLI-FEC error correction unit 93.

Figure 5:
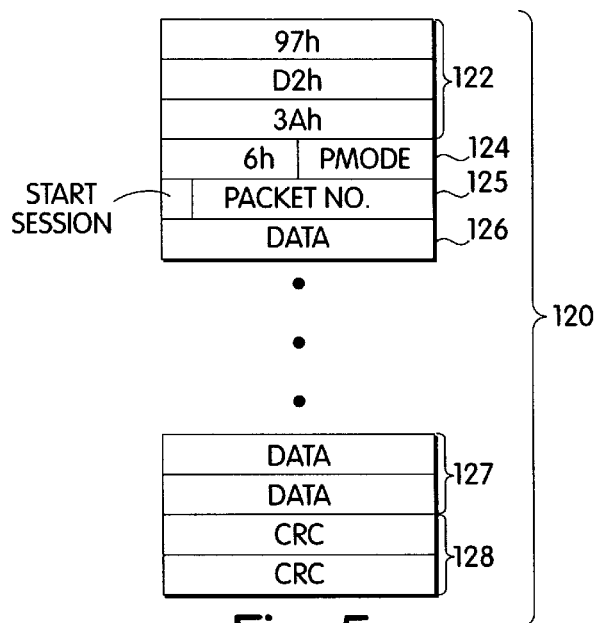
FIG. 5 is a block diagram representation of a data structure for a packet of data.

Referring to FIG. 5, a packet of data 120 is comprised of a plurality of individual bytes 122, 124–128. In a preferred embodiment, data packets such as the packet 120 illustrated in FIG. 5 are used to transmit and receive all the data. Packets are useful for a variety of reasons, including the fact that packets can help insure data integrity and because packets can be processed by the hardware, thus freeing the software for other tasks.

The first three bytes 122 of the packet 120 and the most significant nibble of the fourth byte 124 of the packet 120 form the three and one half byte sync header that is placed at the beginning of each packet. The sync header is useful for detecting the start of the packet 120. As described in more detail hereinafter, the hardware can be configured to detect the start of the packet by recognizing the sync header. In the embodiment illustrated herein, the first three sync bytes are 97h, D2h, 3Ah and the final nibble of the sync header is 6xh.

The least significant nibble of the fourth byte 124 is the PMODE, the packet mode indicator. The PMODE is described in more detail hereinafter.

The fifth byte 125 of the packet 120 includes a start session bit and a packet number. The start session bit is the single most significant bit of the fifth byte 125 and is described in more detail hereinafter. The remaining seven bits of the fifth byte 125 form the packet number. The packet number may be used to sequentially number each packet that is transmitted so that the receiver hardware can determine if the same packet has been received more than once. The packet numbers do not have to be incremented sequentially.

Following the fifth byte 125, the sixth 126 through the nth minus two bytes in the packet 120 are data bytes. Packet sizes may be variable and may be configured according to a packet size register that is one of the registers 81 discussed above. In a preferred embodiment, the packet size is fifty-six bytes. Alternatively, the first data byte 126 can be used to indicate the size of the packet 120. Alternatively yet, fixed packet sizes can be used, although this option appears to be the least flexible.

Following the last data bytes 127 are two CRC bytes 128. The CRC bytes 128 are calculated in a conventional manner and are used to ensure the integrity of data in the packet 120. As described in more detail hereinafter, a received packet is completely discarded if the CRC included with the received packet does not match a CRC value for the received packet calculated by the receiver. Note that although only two CRC bytes 128 are shown in FIG. 5, it is possible to use any number of CRC bytes, such as four bytes.

Packets are formulated by the PC 42 in a conventional manner (i.e., appending the appropriate amount of data to the sync header, PMODE, start session, and packet number). The PC 42, however, does not calculate or append the CRC to the packet. Calculating and appending the CRC for the transmitter is preferably done in hardware as described below.

Figure 6:
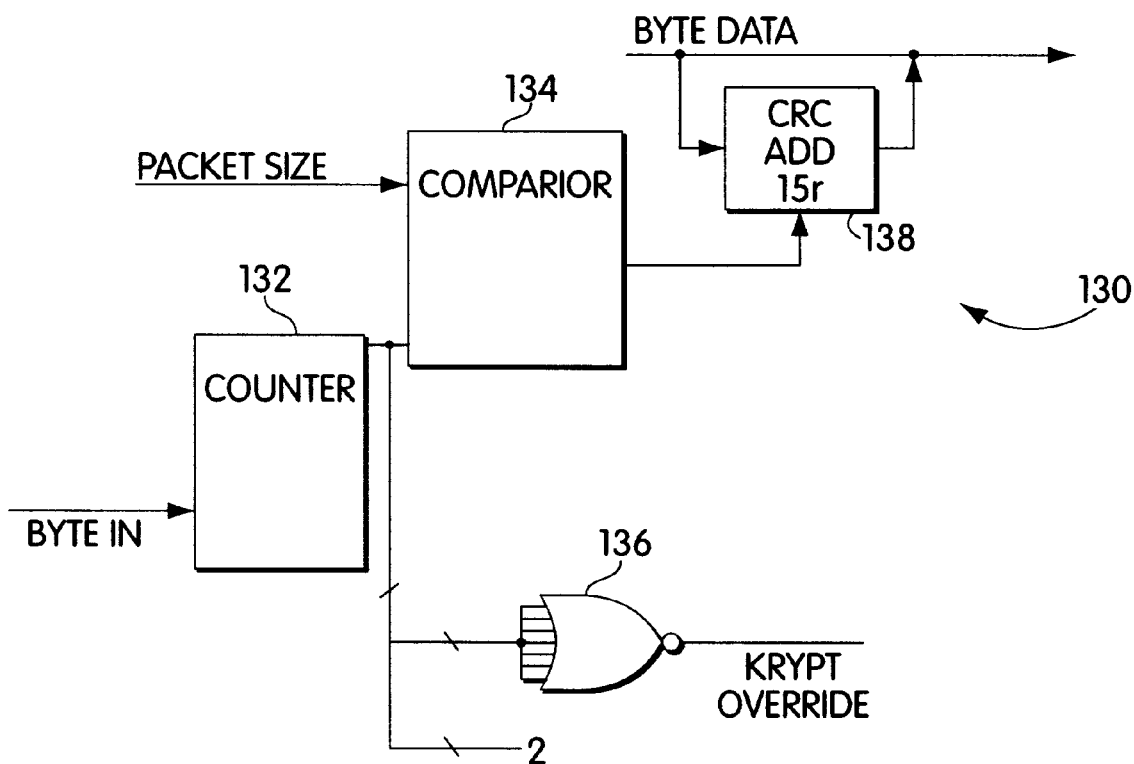
FIG. 6 is a block diagram of a circuit used to handle packet data.

Referring to FIG. 6, a circuit 130 for calculating and adding the CRC data to the end of a packet is shown. The circuit can be part of the packet FIFO 90 or can be separate from the packet FIFO 90. The inputs to the circuit 130 include a PACKET SIZE signal which is a value stored in one of the registers 81 that indicates the size of the packets. Note that if fixed packet sizes are used, then the PACKET SIZE signal can be hardwired to the correct packet size.

The circuit also has BYTE IN and BYTE DATA signal inputs. The BYTE DATA corresponds to the packet data. The BYTE IN signal is a pulse signal that is asserted every time a new byte of packet data is provided to the circuit 130. The BYTE IN signal is used to increment a counter 132 that counts the number of bytes that have been provided for the packet. The output of the counter 132, the number of bytes, is provided to a comparator 134. The other input to the comparator 134 is the PACKET SIZE signal. The comparator 134 provides a boolean output signal that indicates when the number of bytes provided for the packet equals the value of PACKET SIZE.

All but the two least significant bits of the output of the counter 132 are provided to a NOR gate 136. The NOR gate 136 provides a CRYPT OVERRIDE signal during receipt of the first four bytes of the packet. The CRYPT OVERRIDE signal is provided to the mux 86 shown in FIG. 3. The mux 86 selects encryption or no encryption for the data and the CRYPT OVERRIDE signal is provided to the mux 86 in a way to ensure that the packet sync header, which is contained in the first four bytes of the packet, is never encrypted. That is, irrespective of whether encryption is enabled or not, the CRYPT OVERRIDE is provided to ensure that the sync header is never encrypted. Coupling the CRYPT OVERRIDE signal to the mux 86 in this manner is straightforward to one of ordinary skill in the art.

The output of the comparator 134 is provided to a CRC Add unit 138. The CRC Add unit 138 is also provided with bytes of data via the BYTE DATA signal. The CRC Add unit 138 continuously calculates the CRC based on the BYTE DATA signal. When the comparator 134 outputs a signal indicating that the number of bytes received equals the packet size, the CRC Add unit 138 adds the CRC bytes to the end of the packet by providing the CRC bytes at the output thereof.

Figure 7:
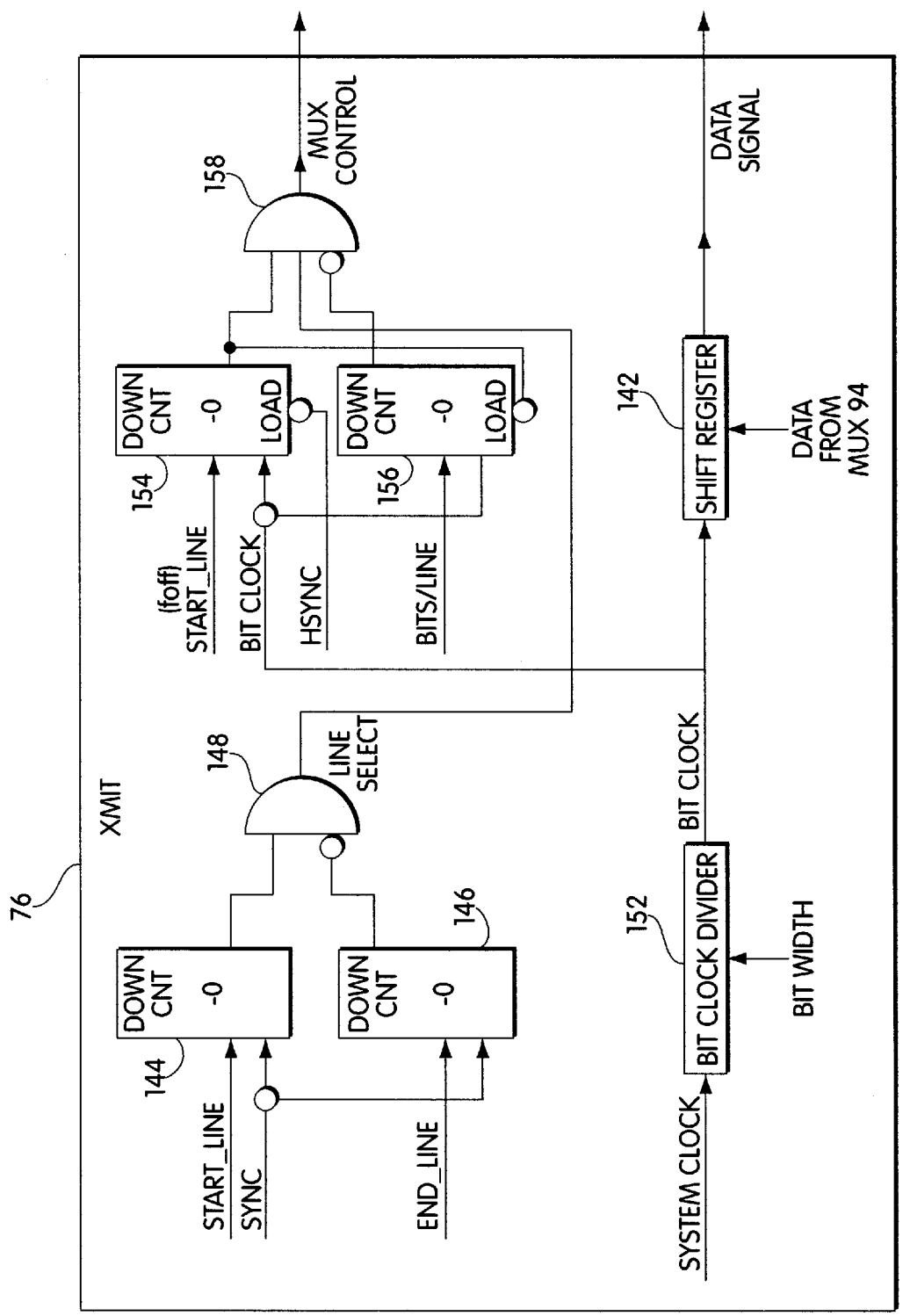
FIG. 7 is a block diagram showing detail of an XMIT unit of the signal processor for the transmitter.

Referring to FIG. 7, the XMIT unit 76 that is shown in FIG. 3 is illustrated in more detail in block diagram format. The XMIT unit 76 uses the data signal from the mux 94 and uses the sync signal to provide an analog data signal output that can be combined with the video signal to provide the MUX CONTROL signal used to switch the data signal into the video output signal, as discussed above in connection with FIGS. 2 and 3. The XMIT unit 76 also provides the DATA signal that is superimposed onto the video signal.

Data from the mux 94 is provided to a shift register 142 which shifts the data out of the shift register 142 to provide the DATA signal in response to simultaneous assertions of both control input signals to the shift register 142. These control input signals include the MUX CONTROL signal and a BIT CLOCK. Generation of the control signals is described in detail hereinafter.

The sync signal that is input to the XMIT unit 76 is provided to a pair of down counters 144, 146. The down counter 144 is initialized with a START_LINE value which is a digital value indicating on which line of the video signal the data is to begin. Note that, generally, data can be transmitted on any line of the video signal. The START_LINE value is provided by one of the programmable registers 81 shown in FIG. 3 and set by data provided from the PC 42 to the signal processor 68. Similarly, the down counter 146 is initialized with an END_LINE that is provided by one of the programmable registers 81 of the signal processor 68. The END_LINE value indicates on which line of the video no additional data will be provided. That is, all of the data is superimposed onto the video signal between START_LINE and END_LINE.

The down counters 144, 146 decrement each time the sync signal indicates that the video signal is transmitting a next line of data. This occurs on each horizontal sync pulse. The output of the down counters 144, 146 is asserted whenever the down counters have counted down to zero. Since the down counter 144 is initialized with the START_LINE value, the output of the down counter 144 is asserted after START_LINE number of horizontal sync pulses have decremented the down counter 144. Similarly, the down counter 146 is initialized with the value of END_LINE and the output of the down counter 146 is asserted after END_LINE number of sync pulses have decremented the down counter 146.

An AND gate 148 is provided with two inputs: the output signal of the down counter 144 and the inverse of the output signal of the down counter 146. The output of the AND gate 148, a LINE SELECT signal, is asserted whenever the output of the down counter 144 is asserted and the output of the down counter 146 is not asserted. This occurs after START_LINE number of lines of video data have been received by the XMIT unit 76 but before END_LINE of video lines have been received by the XMIT unit 76. Accordingly, the LINE SELECT signal is asserted when the current line number of the video signal is between START_LINE and END_LINE.

A bit clock divider 152 is provided with a SYSTEM CLOCK signal input and a BIT_WIDTH input. The SYSTEM CLOCK signal is provided by a conventional system clock that is used to operate the circuitry. The BIT_WIDTH value is one of the programmable registers 81 that can be set to different values. The BIT_WIDTH value indicates the width, in time, of each of the bits of data being transmitted. The ability to modify the time width of each data bit provides great flexibility. In applications where a large amount of data needs to be transmitted, a narrow bit width can be chosen so that the number of data bits per line can be increased. Alternatively, in applications requiring lower transmission data rates, use of a relatively wide bit width decreases the number of transmission errors.

The bit clock divider 152 is a conventional circuit that uses the SYSTEM CLOCK signal and the BIT_WIDTH value to assert the BIT CLOCK signal once for each bit width. For example, if the bit width is 750 nanoseconds, then the BIT CLOCK signal is asserted once every 750 nanoseconds. Similarly, if the BIT_WIDTH value indicates that the bit duration is 250 nanoseconds, then the BIT CLOCK signal is asserted by the bit clock divider 152 once every 250 nanoseconds.

A down counter 154 is initialized with a START_POS value which indicates the starting position of the data on the video line. The START_POS value indicates where, horizontally, the data will be placed on the video line. For example, if the data is to be superimposed on the far right portion of the video line (i.e., the far right portion of the video picture when the video signal is viewed by a conventional viewing device), then the START_POS value would be a relatively high number as compared to the value of START_POS if the data were to be placed on the left-hand portion of the video signal. As with the START_LINE and END_LINE values, the START_POS value is provided by one of the programmable registers 81 shown in FIG. 3.

The down counter 154 is reset (i.e., loaded with the value of START_POS) each time an HSYNC signal, a horizontal sync pulse from the video signal, is received. The horizontal sync pulse is part of the video sync signal and is asserted at the beginning of each line. Therefore, at the beginning of each line of video, the HSYNC signal is asserted and the down counter 154 is loaded with the value of START_POS.

The down counter 154 decrements each time the BIT CLOCK signal is asserted. The output signal of the down counter 154 is asserted when the down counter 154 has been decremented to zero. Accordingly, the down counter 154 counts the number of bit positions in the video line that occur before the data is to be inserted on the video line. For example, if the data is to be inserted on the video line starting at bit position twenty, then the down counter 154 would be initialized with the value of twenty at the beginning of the line (i.e., when HSYNC is asserted) and would decrement each time the BIT CLOCK signal is asserted. Once reaching zero, the down counter 154 would assert the output signal thereof to indicate that START_POS number of bit positions have occurred since the beginning of the video line.

A down counter 156 is initialized with a BITS/LINE value whenever the output of the down counter 154 is asserted. The BITS/LINE value is provided by one of the programmable registers 81 shown in FIG. 3 and indicates the number of bits that are to be provided on each line of the video signal. The down counter 156 is initialized with the BITS/LINE value and decrements once each time the BIT CLOCK signal is asserted. The output of the down counter 156 is asserted once the down counter 156 reaches zero, thus indicating that BITS/LINE number of BIT CLOCK pulses have been received by the down counter 156.

An AND gate 158 determines the logical AND of the output signal of the down counter 154, the inverse of the output signal of the down counter 156, and the LINE SELECT signal. The output of the AND gate 158 is the MUX CONTROL signal which switches the data signal onto the video signal as discussed above in connection with FIG. 2. The MUX CONTROL signal is asserted whenever the LINE SELECT signal is asserted, the output of the down counter 154 is asserted and the output of the down counter 156 is not asserted. This occurs when the video signal is transmitting a line between the START_LINE and END_LINE values in a bit position after the START_POS value but before a number corresponding to BITS/LINE bits have been transmitted for that line.

Figure 8:
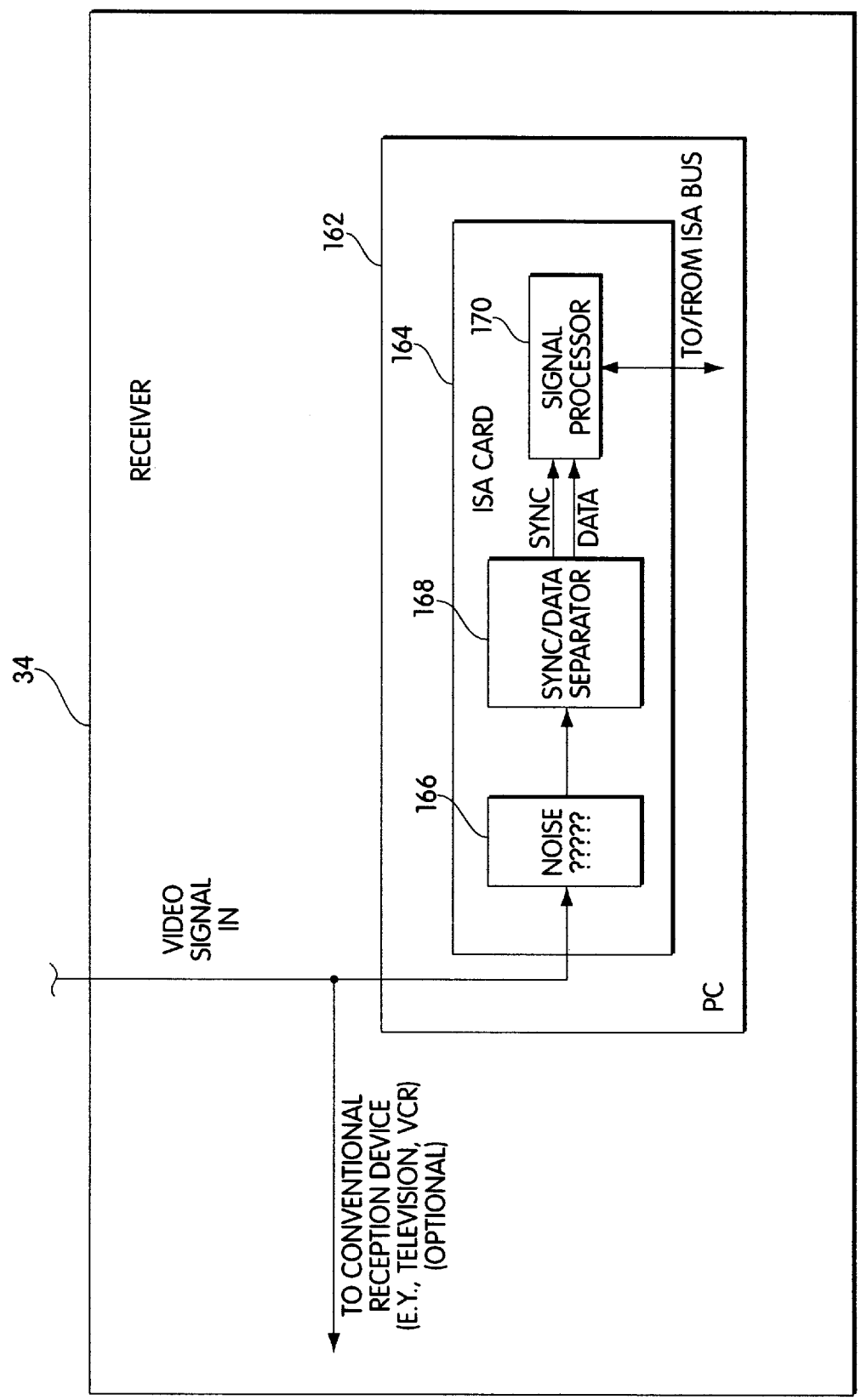
FIG. 8 is a schematic block diagram showing a receiver.

Referring to FIG. 8, one of many possible configurations for the receiver 34 is shown in block diagram format. The receiver 34 receives the input video signal provided by conventional means, such as over the air or coaxial cable transmission or playback of such a transmission from a video tape. Once received, the video signal may optionally be provided to a conventional reception device such as a television or a VCR. In fact, the video signal provided according to the system described herein can be received by a conventional reception device without any regard to the data superimposed onto the video signal by the transmitter 32. Note, however, that the reception device may show picture degradation if the data is superimposed onto a visible portion of the video signal. However, if the entirety of the data is provided during the vertical blanking interval of the video signal, then no picture signal degradation will be apparent to a viewer viewing the signal on a conventional reception device.

The video signal is also provided to a PC 162 that is similarly configured to the PC 42 of the transmitter and includes an ISA card 164 that communicates with the PC 162 via a conventional ISA bus in a conventional manner. The ISA card 164 includes a noise limiter 166, a sync/data separator 168 and a signal processor 170. The signal processor 170 communicates with the ISA bus of the PC 162 or, alternatively, with the SCSI bus of a Macintosh, PC, or workstation in a conventional manner.

The input video signal is first provided to the noise limiter 166 which filters the video signal by attenuating large amplitude portions of the video signal. The noise limiter 166 is essentially an analog circuit that can be implemented in a conventional and straightforward manner by one of ordinary skill in the art.

The output of the noise limiter 166 is provided to the sync/data separator 168 which provides two output digital signals, one corresponding to the video sync signal, and another corresponding to the video data signal. The sync/data separator 168 is implemented using two one-bit A/D converters having transition levels set appropriately to differentiate sync and data signals from the video input signal. For instance, the sync signal output from the sync/data separator 168 is a first digital value whenever the video signal is below a threshold midway between the analog video baseline and the average most negative excursion of the video signal and is a second digital value whenever the analog video signal is above the threshold. Similarly, the digital data signal output from the sync/data separator is a first digital value whenever the video signal exceeds the threshold expected for the data superimposed on the video signal by the transmitter and is a second digital value whenever the video signal is less than the threshold value. This threshold for data can be a point midway between the analog video baseline and the average most positive excursion of the video data pulses.

It is possible for analog video picture information, unrelated to the data superimposed onto the signal, to exceed the expected data threshold value. Therefore, as disclosed in more detail hereinafter, the signal processor uses the sync signal and the data signal to separate out the superimposed digital data from the picture data and provide the data that was superimposed onto the video signal by the transmitter to the PC 162 via the ISA bus.

Figure 9:
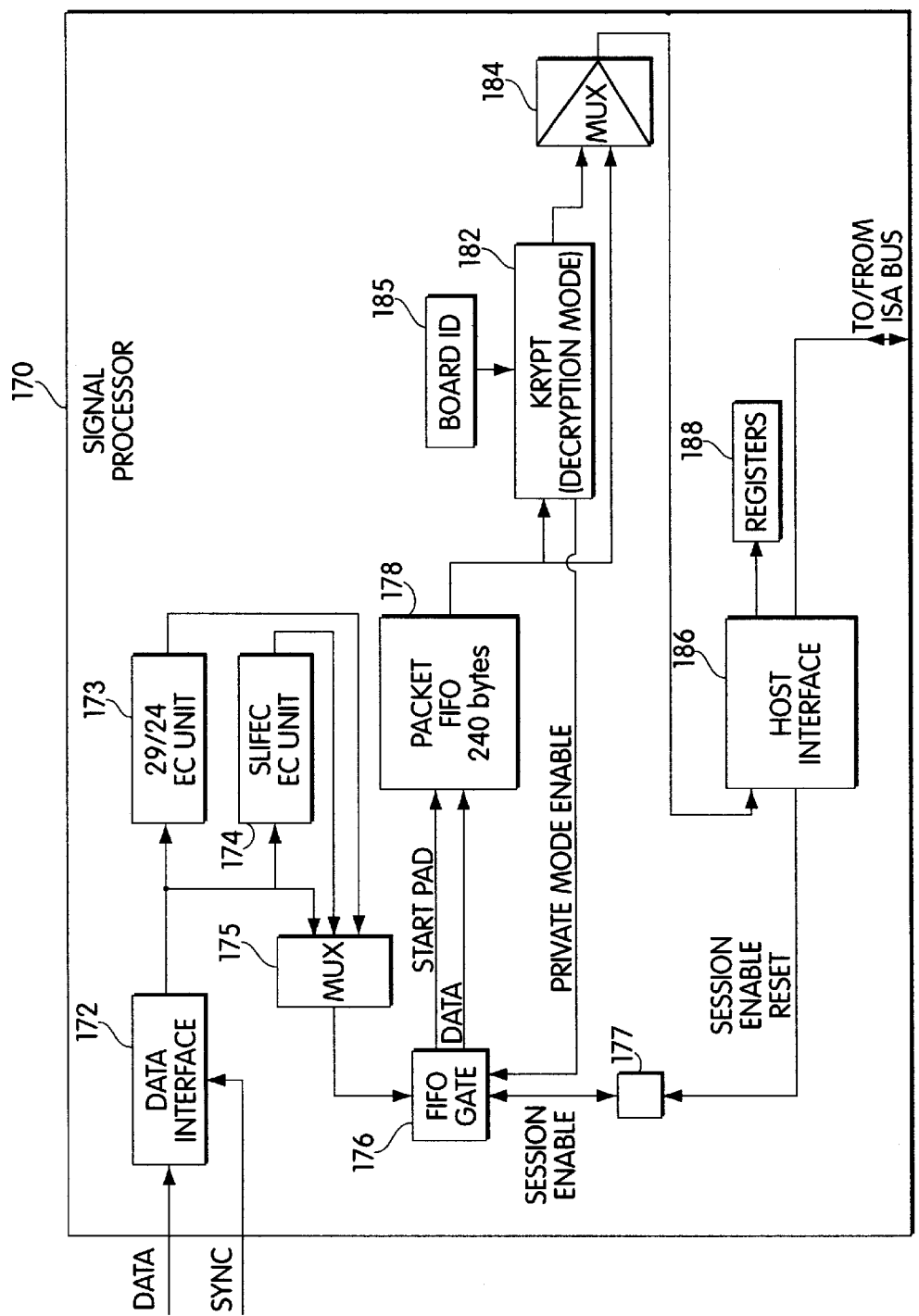
FIG. 9 is a schematic block diagram showing a signal processor of the receiver.

Referring to FIG. 9, a schematic block diagram shows details of the signal processor 170. The signal processor 170 can be implemented using discrete components or can be conventionally designed into a single custom chip, such as an ASIC, to provide equivalent functionality. In a preferred embodiment, it is desirable to reduce costs by using the same ASIC chip for the signal processor 170 as the chip used for the signal processor 68 of the transmitter 32. This is advantageous because the single chip is either transmitting or receiving at any one time and because, as will become apparent from the following discussion, many of the functions provided by the signal processor 68 of the transmitter are similar, if not identical, to the functions provided on the signal processor 170 of the receiver.

The data and sync signals from the sync/data separator 168 are provided to a data interface unit 172. The data interface unit 172 uses the input signals to extract the digital data information that was superimposed onto the video signal by the transmitter. The data interface unit 172 is explained in more detail hereinafter.

The output of the data interface unit 172, the digital data that was superimposed onto the video signal by the transmitter, is provided to a 29/24 error correction unit 173, a SLIFEC error correction unit 174, and to a mux 175. The error correction units 173, 174 are similar to the error correction units 92, 93 shown in FIG. 3 and described above. The error correction units 173, 174 examine the input data and the error correction code, if any, appended thereto to correct any errors in the input data. Note that the SLIFEC error correction unit 174 includes a SLIFEC circuit similar to the SLIFEC circuit shown in FIG. 4 and disclosed above. The SLIFEC circuit of the SLIFEC error correction unit 174 restores the bits of each data words that were "spread apart" by the SLIFEC error correction unit 93 of the transmitter 32. Restoring the original bit positions of the data words is similar to the technique of spreading out the bits of the data words, and implementation would be straightforward to one of ordinary skill in the art in view of the discussion above in connection with FIG. 4.

The error correction units 173, 174 handle examination of error correction codes which may be used by the transmitter 32. In addition, the mux 175 may be used to bypass the error correction units 173, 174 if the data is transmitted without any error correction code. Control of the mux 175 and selection of the error correction technique for the error correction units 173, 174 is done by both the transmitter and the receiver by examining the error mode portion of user settable registers such as the registers 81 of the transmitter 32, discussed above.

The output of the mux 175 is provided to a FIFO Gate 176 which determines if the received data is to be passed on to the remainder of the circuit of the signal processor 170. The FIFO Gate 176 is provided with two control input signals, PRIVATE MODE ENABLE and SESSION ENABLE, which determine if the data received by the FIFO Gate 176 is to be passed on. If either of the control signals indicate that the data from the mux 175 is not to be passed on, then the FIFO Gate 176 does not provide any output. Otherwise, the FIFO Gate 176 outputs the data received from the mux 175 and a signal indicating the start of a packet. The SESSION ENABLE signal is read from and written to a one-bit register 177, which is described in more detail hereinafter. The FIFO Gate 176 and the PRIVATE MODE ENABLE and SESSION ENABLE signals are also discussed in more detail hereinafter.

The output of the FIFO Gate 176 is provided to a packet FIFO unit 178 which is similar to the packet FIFO unit 90 discussed above in connection with the transmitter. The packet FIFO unit 178 receives data a packet at a time and, in a manner disclosed in more detail hereinafter, calculates the CRC and discards packets in which the transmitted CRC does not match the CRC calculated by the packet FIFO unit 178. Packets that are received are either accepted in their entirety or discarded in their entirety by the packet FIFO unit 178.

The output of the packet FIFO unit 178 is provided to both a krypt unit 182 and to a mux 184. The krypt unit 182 decrypts data that was encrypted by the transmitter 32 using one of three conventional DES encryption algorithms. The output of the krypt unit 182 is provided as a second input to the mux 184. The mux 184 selects data either directly from the packet FIFO unit 178 or from the krypt unit 182, depending upon whether the transmitted data was encrypted by the transmitter 32. Control of the mux 184 is provided by conventional logic (not shown) that interfaces with one of the programmable registers that selects whether encryption is to be used and, if so, the type of encryption algorithm.

The krypt unit 182 receives information from a board ID register 185 which may contain a unique board ID for each separate receiver signal processor 170 that is manufactured. The board ID register 185 may be configured at the factory into the custom ASIC chip. However, the board ID register 185 may be set up so as not to be readable by anyone once programmed at the factory. The board ID register 185 may be used by the krypt unit 182 to determine whether to decrypt the received data in a manner described in more detail below.

The output of the mux 184 is provided to a host interface 186 which functions in a manner similar to the host interface disclosed above in connection with the transmitter 32. The host interface 186 handles communications to and from the ISA bus and is used to provide the data from the output of the mux 184 to the PC 162.

Some of the information that is transmitted to the receiver and processed by the signal processor includes configuration information that is written from the host interface to the registers 188. As discussed herein, the registers 188 contain values for controlling different aspects of the receiver 34. Values for the registers 188 can be sent by the transmitter 32 so that the transmitter and any and all receivers are using the same operational parameters such as BIT_WIDTH, START_LINE, END_LINE, START_POS, et cetera. Handling configuration changes between the transmitter 32 and receivers 34–46 is discussed in more detail hereinafter.

Figure 10:
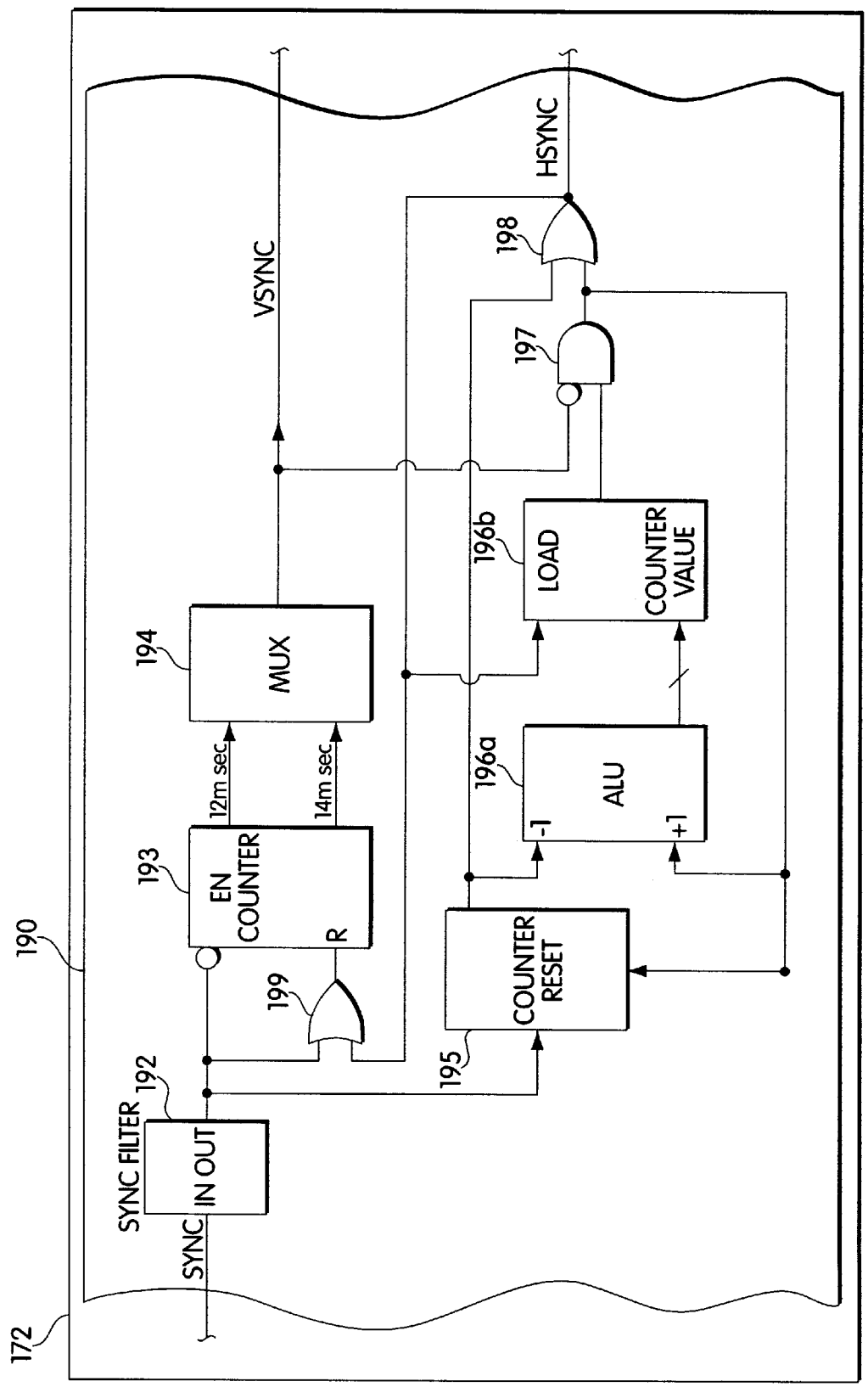
FIG. 10 is a schematic block diagram of a circuit that detects vertical sync and horizontal sync portions of a video signal.

Referring to FIG. 10, a portion 190 of the data interface unit 172 handles detection of the vertical and horizontal sync signal of the input video signal by examining the digitized sync output of the data/sync separator 168 discussed above in connection with FIG. 8. The digitized sync signal is first provided to a sync filter 192 that digitally filters transient noise. The sync filter 192 examines the digital input sync signal and, using conventional means, inverts short strings of ones or zeroes that are less than a certain length. For example, if the sync filter 192 is provided with a string of input bits: one, one, one, one, zero, one, one, one, then the zero bit that is found between the one bits is inverted by the sync filter 192 to become a one bit. In this way, transient portions of the digitized input sync signal are eliminated in order to facilitate follow-on processing of the digitized sync signal.

The parameter that is used to determine the length of short strings of ones or zeros that are to be inverted is programmable based on configuration values provided to one of the registers 188. The specific setting that is selected is based on a variety of functional factors familiar to one of ordinary skill in the art including the transmission characteristics of the channel between the transmitter and the receivers.

The output of the sync filter 192 is provided to an enable input of a counter 193. The enable input (labeled "EN") causes the counter 193 to start counting. The counter 193 begins counting whenever the output of the sync filter 192 is low, indicating the presence of a sync signal. If the EN input to the counter 193 goes high, the counter 193 stops counting. In addition, the counter 193 is reset under certain conditions, described in detail below.

The counter 193 provides two signals to a mux 194, a TWELVE_MICROSECOND signal and a FOURTEEN_MICROSECOND signal. The TWELVE_MICROSECOND signal indicates that the EN input to the counter 193 has been low for twelve microseconds. Similarly, the FOURTEEN_MICROSECOND signal indicates that the EN input to the counter 193 has been low for fourteen microseconds. The mux 194 outputs one of the two input signals based on select logic (not shown) that interfaces in a conventional manner with the programmable registers 188. Note that an NTSC video signal vertical sync serration pulse is twenty-seven microseconds long and that selecting detection of the vertical sync after twelve or fourteen microseconds is based on a variety of functional factors.

The output of the sync filter 192 is also provided to a first counter 195 that detects the horizontal sync pulse provided at the beginning of every line of the video signal. For an NTSC video signal, the horizontal sync pulse is four and one-half microseconds long. Accordingly, the first counter 195 uses system clock pulses (not shown) to detect a string of zeros in the sync data that is more than four microseconds long and less than 5.2 microseconds long.

An ALU 196a and a second counter 196b form a flywheel circuit, which inserts horizontal sync pulses whenever a horizontal sync pulse has not been detected at an expected time (i.e., at an expected location of the input video signal). In a conventional NTSC video signal, a horizontal sync pulse is provided once every sixty-three and one half microseconds. Note, however, that while this number is the ideal period, it is possible in certain situations for the horizontal sync pulse of an NTSC video signal to be provided at a somewhat faster or slower rate. In addition, the input video signal may contain noise or may be lost momentarily, which also affects detection of the horizontal sync pulse.

The ALU 196a provides an output value that is loaded into the second counter 196b. The value provided corresponds to an expected number of system clock pulses (not shown) until the next horizontal sync pulse is expected in the video signal. The second counter 196b is loaded with the output value from the ALU 196a whenever a horizontal sync pulse is detected. The ALU 196a and the second counter 196b thus keep track of the arrival rate of the horizontal sync pulses and, when a horizontal sync pulse does not arrive at the expected time, the second counter 196b asserts an output signal.

The output of the second counter 196b and the inverse of the VSYNC signal are provided to an AND gate 197. Note that it is possible for the second counter 196b to assert an output signal during the vertical sync since no horizontal sync, and hence no output from the first counter 195, will occur during the vertical sync. To keep the flywheel circuit from inserting a horizontal sync at that time, the AND gate 197 gates the output of the second counter 196b with the inverse of the VSYNC signal.

The output of the first counter 195 (a detected horizontal sync pulse) and the output of the AND gate 197 (an expected horizontal sync pulse) are or'ed together with an OR gate 198 to provide the HSYNC signal output. Therefore, the HSYNC signal is asserted whenever a horizontal sync signal is detected in the input video signal or when the flywheel circuit (the ALU 196a and the second counter 196b) determines that a horizontal sync signal should have been detected and should therefore be asserted at the appropriate time.

Note that the output of the AND gate 197 is used to reset the first counter 195. This prevents the first counter 195 from detecting an actual horizontal sync pulse for a particular line of the video signal once the flywheel circuit (the ALU 196a and the second counter 196b) has already inserted a horizontal sync pulse for that same line of the video signal.

The ALU 196a has two inputs labeled "+1" and "−1" which increment and decrement, respectively, the value output by the ALU 196a. When an actual sync signal is detected by the first counter 195, the output value of the ALU 196a is decremented. When the flywheel circuit inserts a horizontal sync signal, the output value of the ALU 196a is incremented. Incrementing and decrementing the output value of the ALU 196a helps synchronize assertion of the HSYNC signal with the actual arrival rate of the horizontal sync portion of the video signal, which may be greater than or less than the rate specified for the NTSC video standard.

The HSYNC signal and the output of the sync filter 192 are provided to an OR gate 199. The output of the OR gate 199 is used to reset the counter 193 so that the counter 193 must receive twelve and fourteen microseconds of new data at the EN input of the counter 193. The reset condition occurs whenever an HSYNC signal is detected or the output of the sync filter 192 is high.

Figure 11:
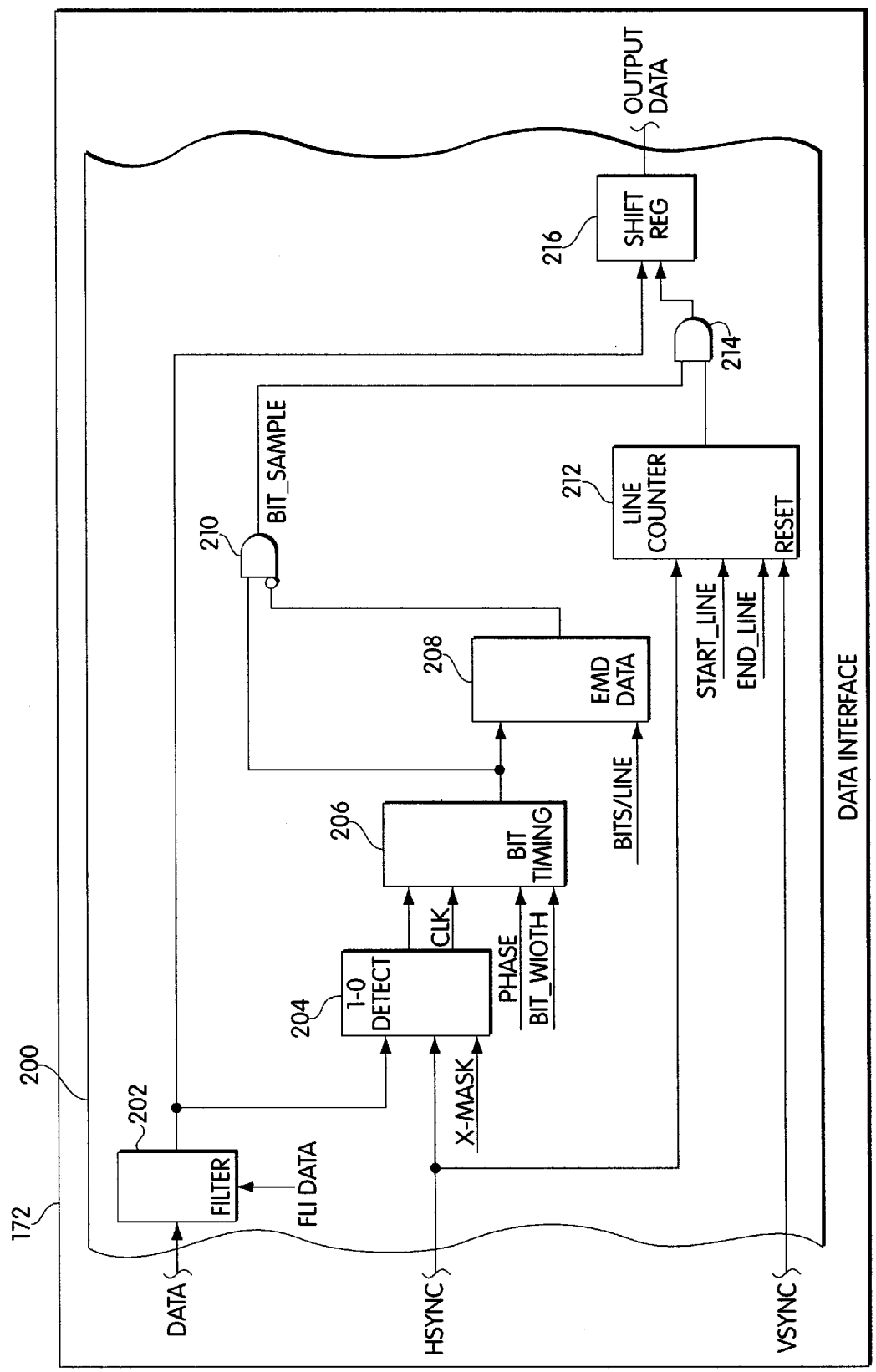
FIG. 11 is a schematic block diagram of a circuit for detecting digital data in a received video signal.

Referring to FIG. 11, a schematic block diagram shows a portion 200 of the data interface 172 used to examine the digital data signal provided by the sync/data separator 168 of FIG. 8. The portion 200 handles filtering the input signal to differentiate between real data signals (data superimposed on the video signal by the transmitter 32) and false data signals (video image data that is part of the picture of the video signal).

The data input to the portion 200 is the one-bit digital data output from the sync/data separator 168, as shown in FIG. 8 and described above. The data is first provided to a filter 202 which filters transient noise out of the data by inverting relatively short sequences of ones and zeros. For example, if the filter 202 receives a sequence of three ones, followed by a zero, followed by three ones, then the filter 202 will invert the zero so that the output of the filter 202 is seven consecutive ones. The filter 202 is implemented using a conventional digital state machine, the implementation of which is straightforward to one of ordinary skill in the art. In addition, characteristics of the filter 202 can be adjusted according to an input from the user registers 188, described above in connection with FIG. 9. The filter 202 uses the register input to determine the minimum length of strings of ones or zeros that are not to be edited. Selecting the value for this input parameter is straightforward to one of ordinary skill in the art based on a variety of functional factors, such as characteristics of the transmission medium between the transmitter 32 and the receivers 34–36.

The output of the filter 202 is provided to a one-zero detect unit 204. The one-zero detect unit 204 is also provided with the HSYNC signal and with additional parameter data from the registers 188. The one-zero detect unit 204 detects a transition from one to zero that is placed at the beginning of each horizontal line of video by the transmitter 32. The one-zero detect unit 204 expects a one-to-zero transition at the beginning of each video line following a certain amount of time after the horizontal sync pulse. The filter data register input to the one-zero detect unit 204 modifies the input sensitivity to noise at the edge of the one to zero transition by determining the minimum number of short strings of ones and zeros that will be ignored by the one-zero detect unit 204.

The output of the one-zero detector 204 is provided to a bit timing unit 206 which uses the system clock and the output of the one-zero detect unit 204 to provide at pulse at the expected start time of each data bit. The bit timing unit 206 provides a first pulse a certain amount of time after the one-zero detect unit 204 has output a pulse for the line. The delay between the output of the one-zero detect unit 204 and the output of the bit timing unit 206 is set according to the value of a PHASE input to the bit timing unit 206. The PHASE value is provided by a programmable register 188 that is set according to a variety of functional factors familiar to one of ordinary skill in the art, including the characteristics of the transmission channel between the transmitter 32 and the receivers 34–36.

The bit timing unit 206 is also provided with the BIT_WIDTH input from the registers 188. The BIT_WIDTH value determines the BIT_WIDTH of each bit of data. As discussed above, wider bit widths provide fewer data errors while narrower bit widths increase data throughput. The bit timing unit 206 asserts an output signal at the expected start time of each bit of data in the video line. The bit time unit 206 is described in more detail hereinafter.

The output of the bit timing unit 206 is provided to an end data unit 208 which determines when there are no more data bits in each line of video data. The end data unit 208 can be implemented using a countdown counter that is initialized to the BITS/LINE value from the registers 188 at the beginning of each line and counts down to zero for each bit pulse that is provided by the bit timing unit 206. Once the end data unit 208 has counted down to zero, the output signal of the end data unit 208 is asserted and remains asserted until the end data unit 208 has been reset for the next line.

The output of the bit timing unit 206 and the inverse of the output of the end data unit 208 are both provided to an AND gate 210 which outputs a pulse (a BIT TIMING signal) for each expect bit position of each bit of data in the lines of video. Each pulse from the bit timing unit 206 is gated through the AND gate 210 by the inverse of the output of the end data unit 208.

A line counter 212 asserts an output signal whenever the VSYNC and HSYNC portions of the video signal indicate that the video signal is between the START_LINE and END_LINE values. The line counter 212 is implemented in a manner similar to that discussed above in connection with FIG. 7 where the down counters 144, 146 and an AND gate 148 assert a LINE SELECT signal when the current line of the video signal is between START_LINE and END_LINE.

The output of the line counter 212 and the output of the AND gate 210 are provided to an AND gate 214 which gates the expected bit signal output from the AND gate 210 by the output of the line counter 212 so that the output of the AND gate 214 is asserted once for each expected bit position if, and only if, the output of the line counter 212 indicates that the video signal is between the user programmable values of START_LINE and END_LINE.

The output of the data filter 202 and the output of the AND gate 214 are provided to a shift register 216 which shifts the output of the filter 202 through the shift register each time the output of the AND gate 214 is asserted. Whatever data is present in the video signal is shifted through the shift register 216 during portions of the video signal at which bit data is expected. As discussed above, the portions of the signal at which data is expected varies according to the user programmable values of START_LINE and END_LINE, BIT_WIDTH, PHASE, BIT/LINE, and filter parameters provided by the user. The output of the shift register 216 is the output digital data that is accessed by the remainder of the signal processor 170.

Figure 12:
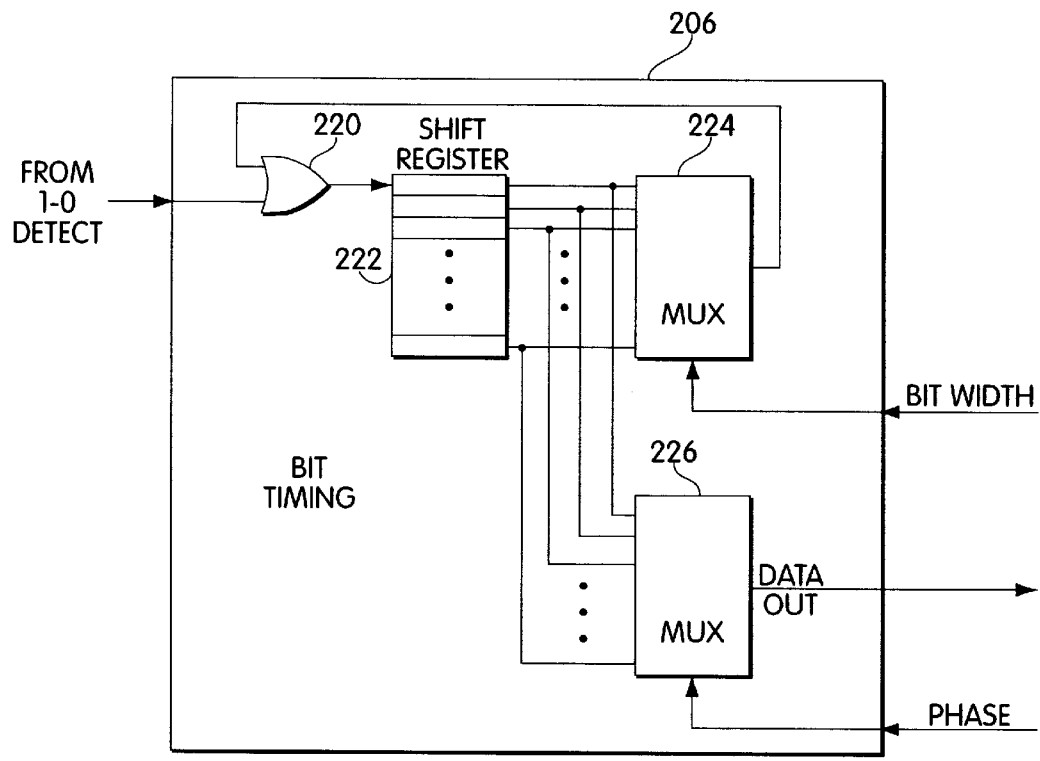
FIG. 12 is a schematic block diagram of a circuit for determining bit timing of digital data superimposed on a video signal.

Referring to FIG. 12, a schematic block diagram shows details of the bit timing unit 206. The input HSYNC signal is provided to an OR gate 220, the output of which is provided to a shift register 222. The shift register 222 has a plurality of output taps that are provided to a first multiplex 224 and a second multiplex 226. The output of the first multiplex 224 is selected by the BIT_WIDTH input. The output of the multiplex 224 is fed back in through the OR gate 220 to the shift register 222. Therefore, the value of BIT_WIDTH controls how many times the input to the shift register 222 will shift through the shift register 222 before being fed back into the input of the shift register 222 by the output of the multiplex 224 through the OR gate 220.

The multiplex 226 is controlled by the value of the phase input to the multiplex 226. The multiplex 226 determines which output of the shift register 222 will be provided as the output of the bit timing unit 206. Essentially, the value of the phase controls the multiplex 226 to determine the phase difference between the input to the shift register 222 and the output of the bit timing unit 206.

Figure 13:
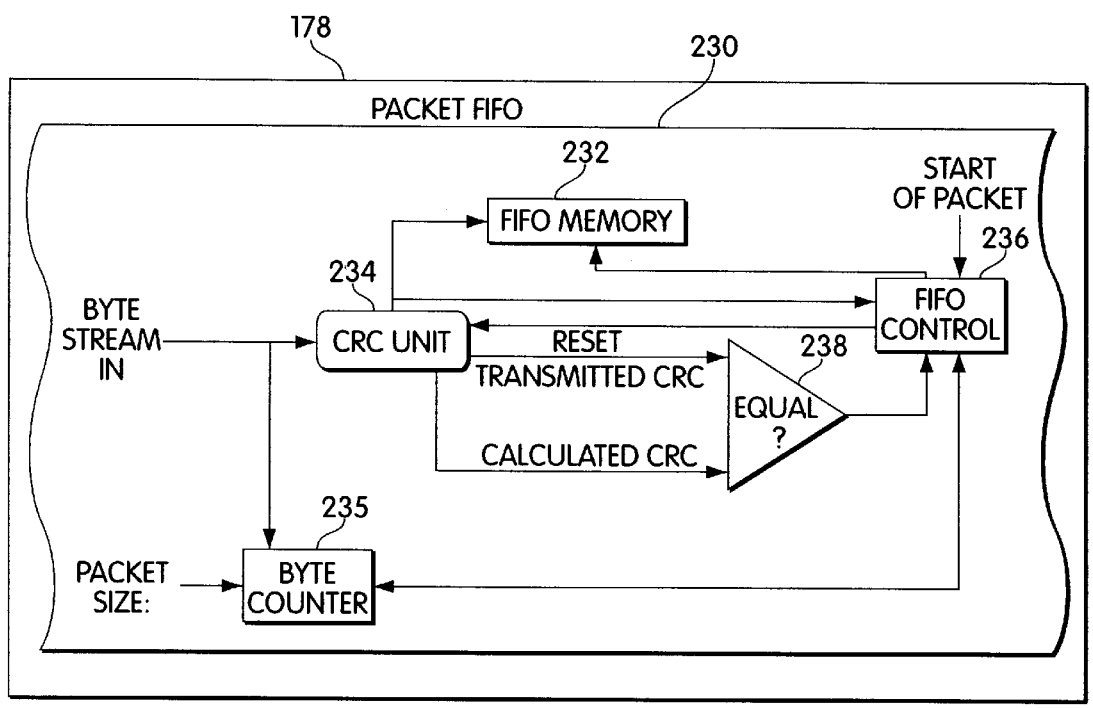
FIG. 13 is a schematic block diagram showing in detail a portion of a packet FIFO for the signal processor for the receiver.

Referring to FIG. 13, a portion 230 of the packet FIFO unit 178 includes hardware for handling receipt of data packets. The hardware handles validation and storage of each packet received. If a received packet is deemed invalid because the calculated CRC does not match the translated CRC, then the entire packet is discarded and none of the data therein is provided to any other portion of the receiver. Packets of data are either discarded or retained in their entirety.

The line labeled BYTE STREAM IN on the portion 230 represents the data provided to the packet FIFO unit 178 by the FIFO Gate 176. The input data is provided to a FIFO memory 232, a CRC unit 234, a byte counter 235, and a FIFO Control unit 236. The FIFO memory 232 is a conventional first-in/first-out memory used to store the received data. If the received packet is deemed invalid then all of the data from the invalid packet stored in the FIFO memory 232 is eliminated, as described in detail hereinafter.

The CRC unit 234 calculates a running CRC as each byte of the data is received. At the end of the packet, the CRC unit 234 provides two outputs, an original CRC and a calculated CRC. The original CRC is the CRC data received at the end of the packet and formulated and transmitted by the transmitter. The calculated CRC is the CRC calculated by the CRC unit 234 as each byte of the packet is received. Both the original CRC signal and the calculated CRC signal are provided to a comparator 238 which compares the two values and generates a signal indicating whether the original CRC equals the calculated CRC.

The byte counter 235 receives both the input byte stream and a PACKET_SIZE value. The PACKET_SIZE value is provided by the configurable registers 188, discussed above, and indicates the size of the packets transmitted (and hence the size of packets received) in the system. The byte counter 235 outputs a signal indicating that the end of the received packet has been reached by determining that PACKET_SIZE number of bytes have been received since the beginning of the packet. Although the packet size is configurable, both the transmitter and receiver must use the same packet size for the CRC calculation to operate properly. The mechanism for setting and agreeing upon the packet size for both the transmitter 32 and the receivers 34–36 is described in more detail below.

The FIFO control unit 236 processes the output of the comparator 238 and the output of the byte counter 235 to determine if the received packet is valid. Note that the FIFO control unit 236 also receive a signal indicating the start of the packet. This signal is used by the FIFO control unit 236 to reset the byte counter 235 and the CRC unit 234 in a conventional manner. The FIFO control unit 236 determines if a valid packet is received by insuring that the output of the comparator 238 indicates that the transmitted CRC equals the calculated CRC when the end of packet signal is asserted by the byte counter 235. If the received packet is invalid because the transmitted CRC does not equal the calculated CRC, the FIFO control unit 236 sends a signal, in a conventional manner, to the FIFO memory 232 indicating that the entirety of the received packet is to be removed from the FIFO memory 232. The portion 230 of the packet FIFO 178 that handles receipt and validation of packets thus eliminates invalid data that is received and relieves the follow-on hardware and software from the responsibility of examining packets for valid CRC values.

Referring to FIG. 14, a table 240 indicates possible bit values for the four-bit PMODE value (PMODE nibble) that is included in the packet header and described above in connection with FIG. 5. If bit three of the PMODE value is set to zero, the table 240 indicates that the packet associated therewith is a public packet. A public packet is one that can be received by all receivers.

The table 240 indicates that if bit three of the PMODE nibble is set to one, the packet associated therewith is a private packet. A private packet is a packet that is intended for a finite and identifiable group of receivers. Identifying and enabling the receivers that are allowed to receive a private packet is discussed in more detail hereinafter.

The table 240 indicates that if both bit one and bit zero of the PMODE nibble are set to zero, then the packet associated therewith is a normal data packet. The table 240 also indicates that if bit one of the PMODE nibble is set to zero and bit zero of the PMODE nibble is set to one, then the packet associated therewith is a board ID packet. The board ID packet is used in conjunction with the private packet bit in a manner described in more detail hereinafter.

In certain instances, it may be desirable for the transmitter 32 to transmit data only to certain ones of the receivers. One way to prevent unauthorized users from also receiving the data is to encrypt the transmitted data. However, if all users are capable of decrypting the data, then encrypting the data does not necessarily restrict receipt of the data to a predefined subset of users. However, each user is provided with a unique board ID that is programmed in the board ID register 185 shown in FIG. 9 and discussed above. As indicated above, the board ID register 185 is set by the manufacturer at the factory and cannot be read by the user. Accordingly, one way for a transmitter to restrict receipt of data is to indicate the board ID's of the intended or authorized recipients.

The transmitter 32 encrypts or accesses encrypted versions of the board ID's corresponding to the desired receivers using, for example, the ECB DES encryption algorithm. The encrypted versions of the board ID's are then transmitted in a data packet in which the PMODE nibble indicates that the data packet is a board ID packet. Each recipient will receive the board ID packet and decrypt each board ID contained in the packet. If one of the decrypted board ID's matches the board ID stored in the register 185 of the receiver, then the recipient is authorized to receive the subsequent encrypted data. In that case, the krypt unit 182 will assert the PRIVATE MODE ENABLE signal indicating to the FIFO Gate 176 that the receiver 34 has been enabled to receive subsequent private mode packets.

Following transmission of all of the board ID packets indicating all of the authorized recipients, the transmitter transmits the data in normal data packets but with the private packet bit set indicating that only those recipients whose board ID's were previously sent in a board ID packet are enabled to receive the packet. All non-enabled recipients that receive the private packets will note that the PMODE indicates that the packet is a private packet and that the board ID of the non-enabled recipient was not previously set in a board ID packet. Private packets are sent until the transmitter sends a packet with the PMODE nibble indicating a public packet is being sent which is usable by all recipients. Private packets may be encrypted using, for example, one of three conventional and well-known DES algorithms, ECB, OFB, or CFB.

Note that the board ID register 185 is set at the factory and is not readable by a user or anyone else examining the ASIC chip. This facilitates security and prevents unauthorized receivers from "cloning" an ASIC chip since they cannot easily duplicate the board ID. In addition, making the board ID inaccessible prevents users from tampering with the initially assigned board ID that is stored in the board ID register 185.

It is possible for the transmitter and receiver to vary many operational configuration parameters that are used by the transmitter and receiver. These parameters include, among others, the START_LINE value (first video line with data), the number of bits per video line, the END_LINE value (the last video line containing data), the START_POS value (the location where data begins on the video line), and the PACKET_SIZE value (the number of bytes per packet). Of course, for the transmitter and receiver to communicate effectively, both must agree upon the values for the configuration parameters. Otherwise, the receiver may be looking for data in the wrong location. For example, if the transmitter is transmitting data beginning at line twelve and ending at line fifteen of the video signal, but the receiver is expecting to receive data beginning at line twenty and ending at line twenty-five, then the receiver will not detect the data sent by the transmitter. This occurs because the receiver hardware, described above, uses the configuration parameters to detect data in an expected portion of the video signal.

The configuration parameters for the transmitter can be set by software in the PC 42 which drives the transmitter hardware. The configuration parameters can be provided to the ISA card 62 via the ISA bus of the PC 42 in a conventional manner. However, it is not sufficient to change only the configuration parameters of the transmitter. As discussed above, it is necessary to change the configuration of both the transmitter and the receiver simultaneously so that the receiver can properly receive data.

Referring to FIG. 15, a table 250 shows configuration data that can be sent from the transmitter 32 to the receivers 34–36. The configuration data can be contained in a normal public data packet (i.e., the PMODE bits equal 0x00). The first byte of data of the data packet can be a packet ID that indicates that the packet contains configuration data. In the embodiment illustrated herein, the first byte of the data packet is set to FFh to indicate that the remainder of the data in the data packet contains configuration data. Following the packet ID, the remainder of the data in the data packet is set according to the table 250 of FIG. 15. Many of the fields that are configurable have been discussed above in connection with discussion of the transmitter and receiver hardware. Other ones of the fields do not relate to the hardware. Note that the table 250 can be expanded, modified, reduced, etc. as appropriate depending upon the configuration parameters that the user desires to dynamically modify during transmission.

The data that is transmitted by the transmitter 32 to the receivers 34 can be grouped into large numbers of packets called "sessions". Each session of data could relate to a particular topic or aspect of the video program being shown. In addition, as discussed in more detail hereinafter, the receiver can examine the data at the beginning of a session and indicate to the receiver hardware to ignore the remainder of the data of the session. Furthermore, a receiver that is powered-up and begins receiving data in the middle of a session may ignore the data until the start of the next session.

The packet that is transmitted at the beginning of each session has the start session bit of the packet header set. As discussed above in connection with FIG. 5, the start session bit is the most significant bit of the fifth byte 125 of the packet header. As discussed in more detail hereinafter, the receiver hardware recognizes the start session bit and passes the data on to the receiver PC for examination. If the receiver does not wish to receive the remainder of the session, then, as discussed in more detail hereinafter, the software on the receiver PC provides a command to the receiver hardware to instruct the hardware to not pass any additional received data on to the PC software until a packet is received with the start session bit set indicating a new session has begun.

Figure 16:
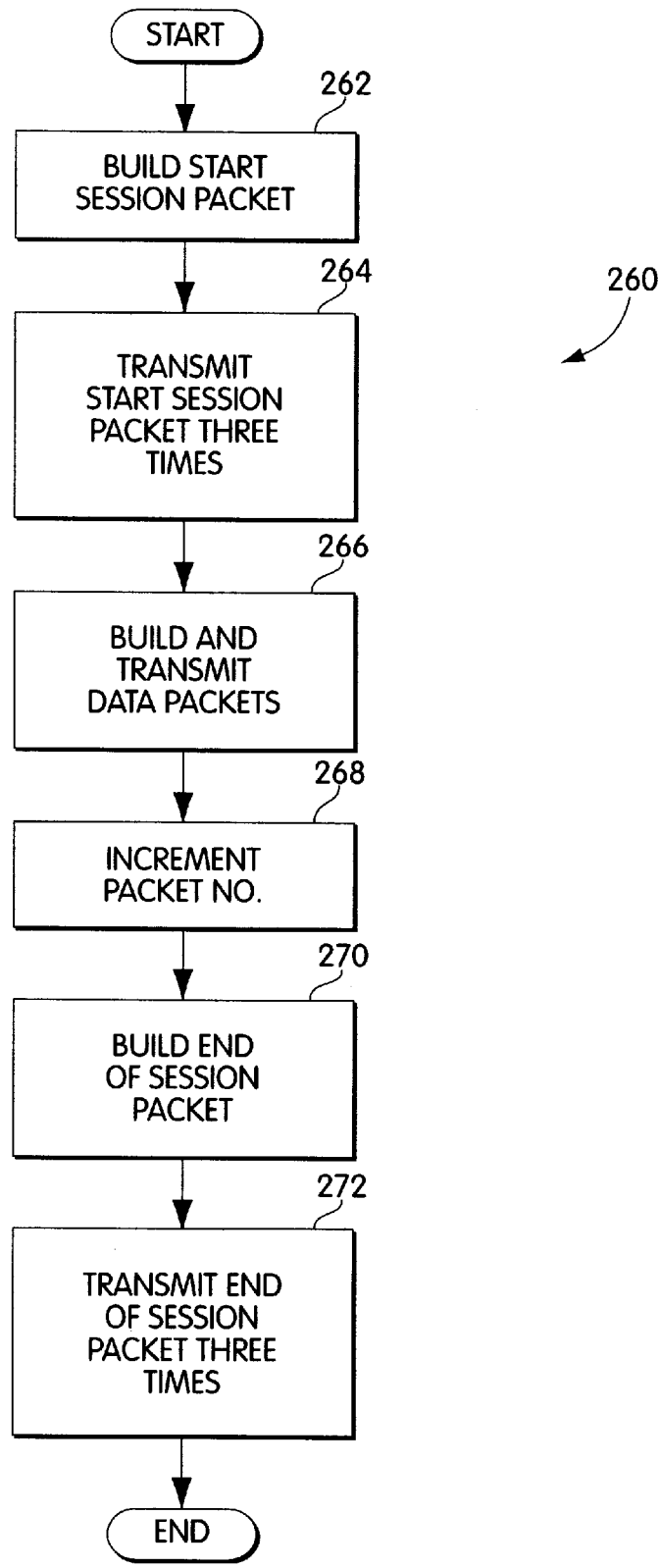
FIG. 16 is a flow chart illustrating operation of PC software for the transmitter.

Referring to FIG. 16, a flow chart 260 illustrates software in the PC 42 of the transmitter 32 used to send a single session's worth of data. At a first step 262, the software of the PC 42 builds the start session packet. The start session packet has the start session bit in the packet header set and includes session identification information identifying the session, and perhaps the nature of the data provided therewith, to the receivers.

Following the step 262 is a step 264 where the transmitter transmits the start session packet three times. Transmitting the start session packet three times makes allowances for cases where one or two of the start session packets could get lost and/or garbled during transmission, thus providing the receivers with three opportunities to receive the start session packet. The packet number for all three transmitted start session packets may be set to zero, thus indicating to the receiver that the same packet is being transmitted three times.

Following the step 264 is a step 266 where the PC 42 builds and transmits the data packets associated with the session. None of the data packets transmitted at the step 266 have the start session bit since the packets transmitted at the step 266 correspond to data within the session and not data at the beginning of a session. The step 266 includes other substeps which are described in more detail hereinafter. Following the step 266 is a step 268 where the packet number used to transmit packets in the step 266 is incremented from the last value of the packet number at the step 266. In a preferred embodiment, only the start session packet has a packet number of zero and all other packets have a packet number that ranges between one and one hundred twenty-seven.

Following the step 268 is a step 270 where the end of session packet is built. The end of session packet will include the packet number that was incremented at the step 268. Accordingly, incrementing the packet number at the step 268 alerts the receiving hardware that the end of session packet is the next packet in the sequence following the last packet that was transmitted at the step 266.

Following step 270 is a step 272 where the end of session packet is transmitted three times. The packet number for each of the three redundant end of session packets transmitted at the step 272 is not incremented, thus alerting the receivers that the same packet is being redundantly transmitted. Just as with the step 264, transmitting the end of session packet three times at the step 272 provides the receivers with three opportunities to receive an indication that the session has ended. Transmission of the session is complete following the step 272. Of course, the PC 42 can begin to transmit another session's worth of data by returning to the step 262 and starting the next session.

Some of the data stored in the packet may be used to indicate the nature of the data. For example, the byte at position zero of the packet may be a packet ID that indicates whether the packet is a control packet or a data packet. If the packet is a data packet, the first byte may indicate the size of the packet. As shown in FIG. 15, a 0xFFh in the first byte of the packet is used to indicate that the packet is a control packet. Any value in the first byte between zero and EFh indicates the size of a data packet.

The second and third bytes in the data field of the packet may indicate a segment ID and a sequence number. The segment ID may be the high nibble of the second byte of the data field and may be used, in a manner described in more detail below, to differentiate and distinguish the data packets. Similarly, the sequence number may be the lower four bits of the second byte and the entirety of the third byte of the data in the packet and may also be used, in a manner described in more detail below, to distinguish various packets. The size of the segment ID field does not limit the number of different segments in a session since the segment ID can wrap from its maximum value back to zero.

Figure 17:
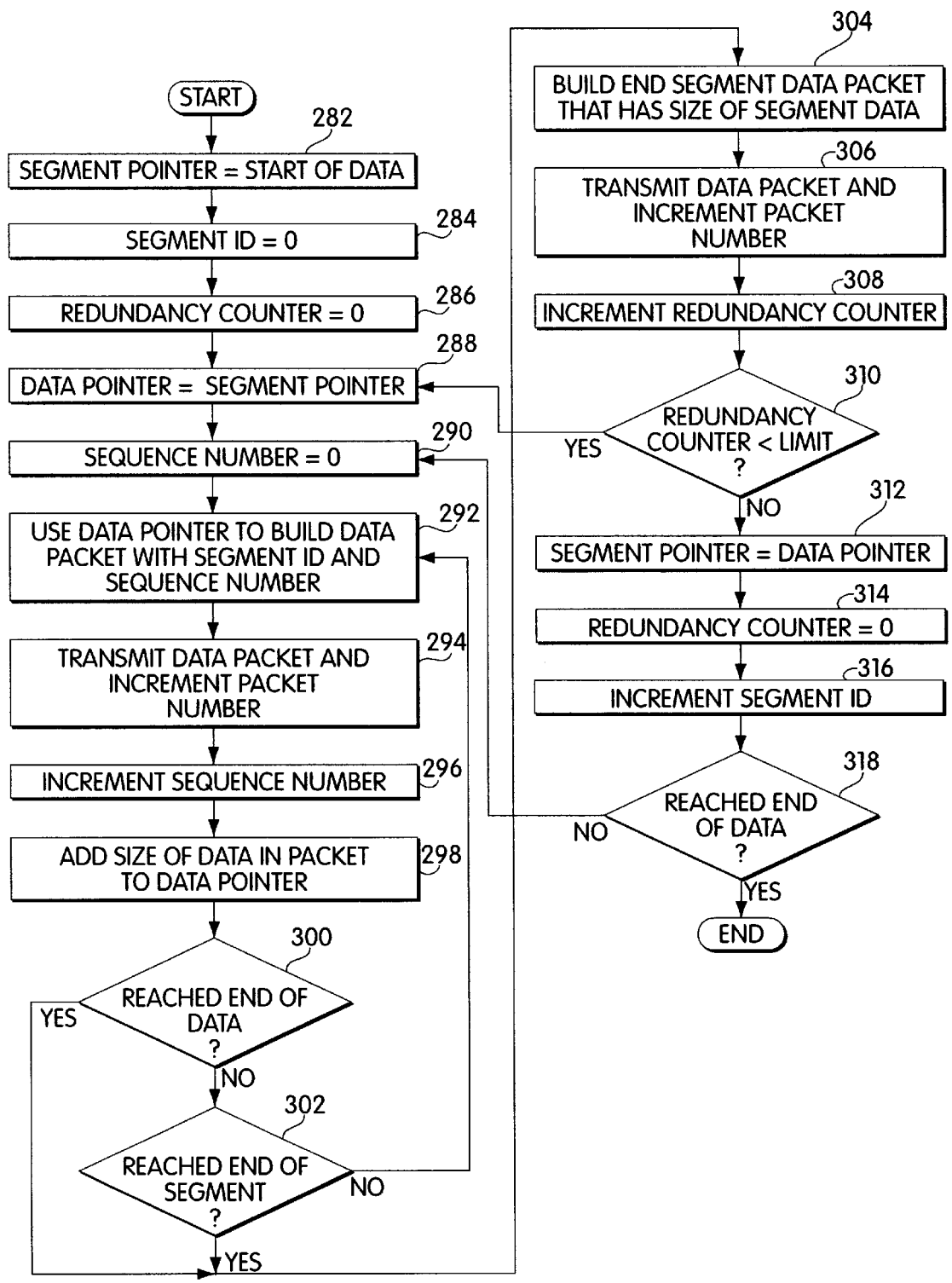
FIG. 17 is a flow chart illustrating PC software for handling transmission of data.

Referring to FIG. 17, a flow chart 280 shows in detail the steps that are performed in connection with the step 266 of FIG. 16. Within a session, data may be transmitted in one or more groups of packets called "segments". A segment is simply an arbitrary group of packets. In a preferred embodiment, segments are configured to contain approximately sixteen thousand bytes. In addition, note that transmission accuracy can be increased if segments are transmitted more than once. In that case, the receiver can examine the sequence numbers (discussed above) of the received packets within a segment and, when the segment is transmitted again, the receiver can examine the packets for sequence numbers that were not received the first time that the segment was transmitted. This mechanism is described in more detail below.

In the flow chart 280, processing begins at a step 282 where a segment pointer, the pointer within the data that is to be transmitted, is set equal to the start of the data that is to be transmitted. Following the step 282 is a step 284 where a segment ID is initialized to zero. Following the step 284 is a step 286 where the redundancy counter is set equal to zero.

Following the step 286 is a step 288 where a data pointer is set equal to the segment pointer. Note that for the first iteration (i.e., the first time the step 288 is executed) that the data pointer will be set equal to the start of data at the step 288. This may not be the case for subsequent iterations.

Following the step 288 is a step 290 where the sequence number is set equal to zero. Following the step 290 is a step 292 where the data packet is built using the data pointer to obtain the data being sent. In addition, the data packet will include the segment ID and sequence number. Following the step 292 is a step 294 where the data packet is transmitted and the packet number, which is part of the packet header, is incremented. Note that, as discussed above in connection with FIG. 16, the packet number is initially set to zero when the start session packet is transmitted, prior to transmission of the data.

Following the step 294 is a step 296 where the sequence number is incremented. Following the step 296 is a step 298 where the data pointer into the data that is being transmitted is adjusted to point to the beginning of the next block of data that is to be transmitted.

Following the step 298 is a test step 300 which determines if the data pointer has reached the end of the data that is to be transmitted. If at the test step 300 it is determined that the end of data has not been reached, then control passes from the step 300 to a test step 302 to determine if the end of the segment has been reached. If it is determined at the test step 302 that the end of the segment has not been reached then control passes from the step 302 back up to the step 292 to transmit another packet of data.

If at the step 300 it is determined that the end of the data has been reached, or if it is determined at the step 302 that the end of the segment has been reached, control passes from either the step 300 or the step 302 to a step 304 where the end segment data packet is built. The end segment data packet includes the size of the segment that is being ended. Note that the end of segment indicator is embedded within data in the segment. Similarly, a start of segment indicator can also be embedded in the segment. Note also that a single session can include multiple segments so that a single start session packet can be followed by more than one distinct segment.

Following the step 304 is a step 306 where the end segment data packet is transmitted and the packet number is incremented. Following the step 306 is a step 308 where the redundancy counter is incremented. Following the step 308 is a test step 310 where it is determined if the redundancy counter is less than a limit for the redundancy counter which is settable by the transmitter 32. The limit is used to determine how many times a segment of data will be sent. Determining a value for the limit is straightforward to one of ordinary skill in the art based on a variety of functional factors including the quality of the transmission channel. If the transmission channel is poor and introduces many errors into a transmission, then the limit would be set higher than if the transmission channel were relatively good and introduced relatively few errors.

If it is determined at the step 310 that the redundancy counter is less than the limit, then control passes from the step 310 back to the step 288 to resend the segment. Note that when the segment is resent, it is possible to rearrange the order of the packets provided that the sequence numbers, stored in the data portion of the packet, are maintained.

If it is determined at the step 310 that the redundancy counter is not less than the limit, then control passes from the step 310 to a step 312 where the segment pointer is set equal to the data pointer in order to prepare to send the next segment of data. Following the step 312 is a step 314 where the redundancy counter is set to zero. Following the step 314 is a step 316 where the segment ID is incremented indicating that a new segment is being sent. Following the step 316 is a test step 318 which determines if the end of data has been reached. If it is determined at the test step 318 that the end of data has been reached, then all the data has been sent and processing is complete. Otherwise, if it is determined at the test step 318 that all the data has not been sent, then control passes from the test step 318 back up to the step 290 in order to send more data.

Figure 18:
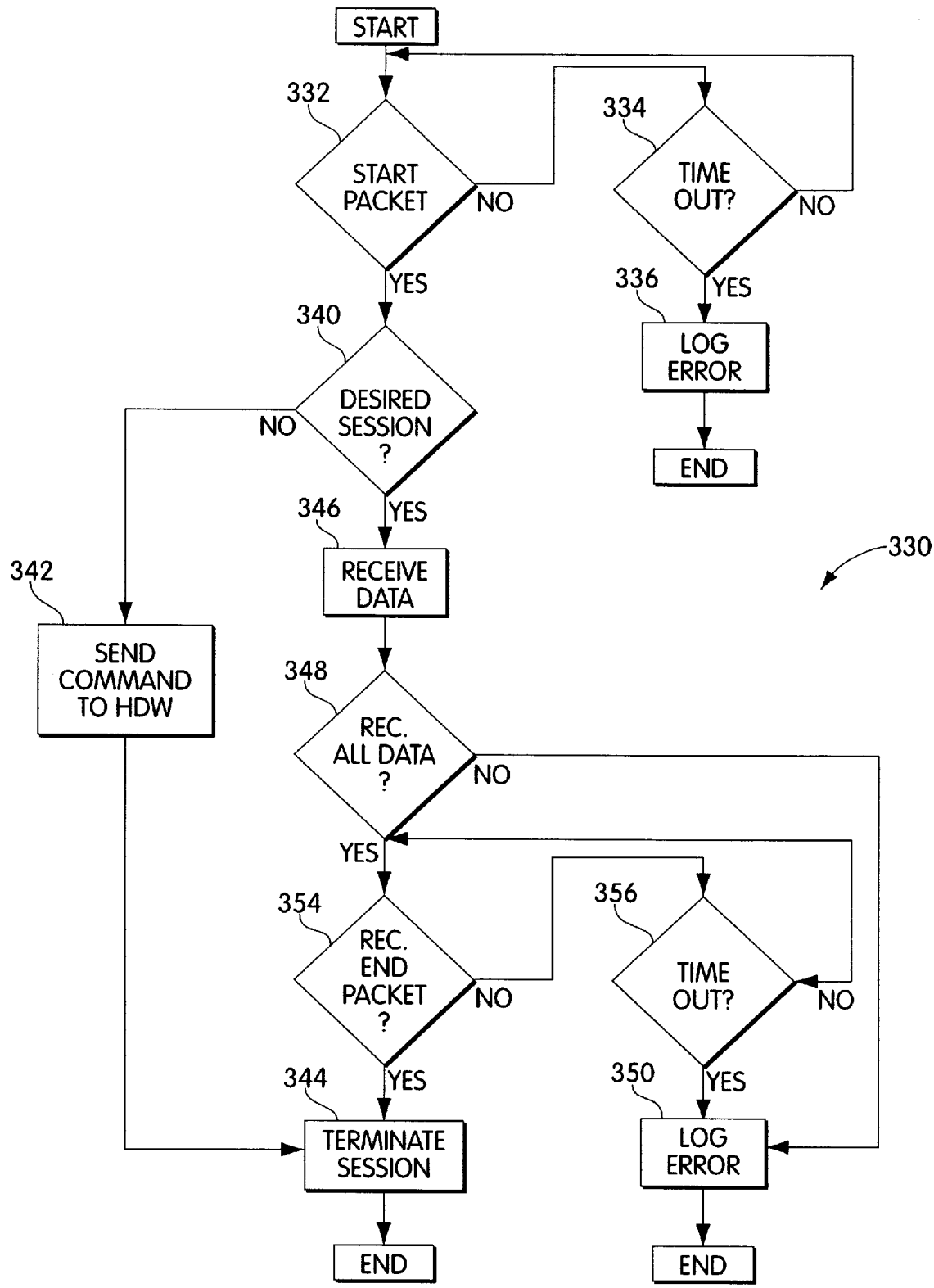
FIG. 18 is a flow chart illustrating operation of PC software for the receiver.

Referring to FIG. 18, a flow chart 330 shows the overall flow for the software on the PC 162 of the receiver 34 that handles receiving the data. At a first test step 332, the software determines if a packet having the start session bit that has been received. If not, then control passes to another test step 334 which determines if there has been a timeout. A timeout occurs when the time at which the software expects to receive a packet having a start of session bit set (i.e., a session header) has been received. The value for the timeout is a design choice based on the specific implementation of the system. If it is determined at the test step 334 that there has been no timeout, then control transfers from the step 334 back to the step 332 to determine if a start packet has been received. Otherwise, if it is determined at the test step 334 that there has been a timeout, then control passes from the step 334 to a step 336 where an error is logged. Following the step 336, processing is complete.

If it is determined at the test step 332 that a start packet has been received, then control passes from the step 332 to a test step 340 to determine if the PC desires to receive the session of data. As discussed above, it is possible for receivers to selectively choose which sessions will be received and which sessions will not be received. If it is determined at the step 340 that the session is not a desired session, then control passes from the step 340 to a step 342 where the PC sends a command to hardware indicating that the PC 162 does not desire to receive any data associated with the session being sent. The command to the hardware includes a command to the host interface 186 to unassert the SESSION ENABLE signal, thus clearing the bit in the register 177.

Once the PC has sent the command at the step 342, the PC does not receive any data from the session and does not receive any data at all until the beginning of the next transmitted session. Following the step 342 is a step 344 where the PC terminates the session. Following the step 344, processing is complete for the particular session, although at this point the receiver could loop back to the start of the processing to wait for another session.

If it is determined at the step 340 that the PC 162 desires to receive the session, then control passes from the step 340 to a step 346 where the PC receives the data associated with the session. The step of receiving the data 346 is discussed in more detail hereinafter.

Following the step 346 is a test step 348 which determines if all of the data of the session has been received. If it is determined at the test step 348 that not all of the data has been received, then control passes from the step 348 to a step 350 where the error is logged. Following the step 350, processing for the session is complete.

If it is determined at the step 348 that all of the data for the session has been received, then control passes from the step 348 to a test step 354 where it is determined if the end of session packet has been received. If so, control passes from the step 354 to the step 344 where the session is terminated. Otherwise, if it is determined at the step 354 that the end of session packet has not been received, then control passes from the step 354 to a test step 356 which determines if a timeout has occurred waiting for the end of session packet. Just as with the timeout waiting for the start of session packet, discussed above in connection with the test step 334, the timeout waiting for the end of session packet occurs at the step 356 when a predetermined amount of time has passed and the end of session packet has not been received. The choice of the amount of time required for a timeout is a straightforward design choice based on a variety of functional factors known to one of ordinary skill in the art.

If it is determined at the step 356 that a timeout has not occurred, then control passes from the step 356 back to the step 354 to determine if an end of session packet has been received. Otherwise, if it is determined at the step 356 that a timeout has occurred, then control passes from the step 356 to the step 350 where the error is logged, following which processing for the packet is complete.

Figure 19:
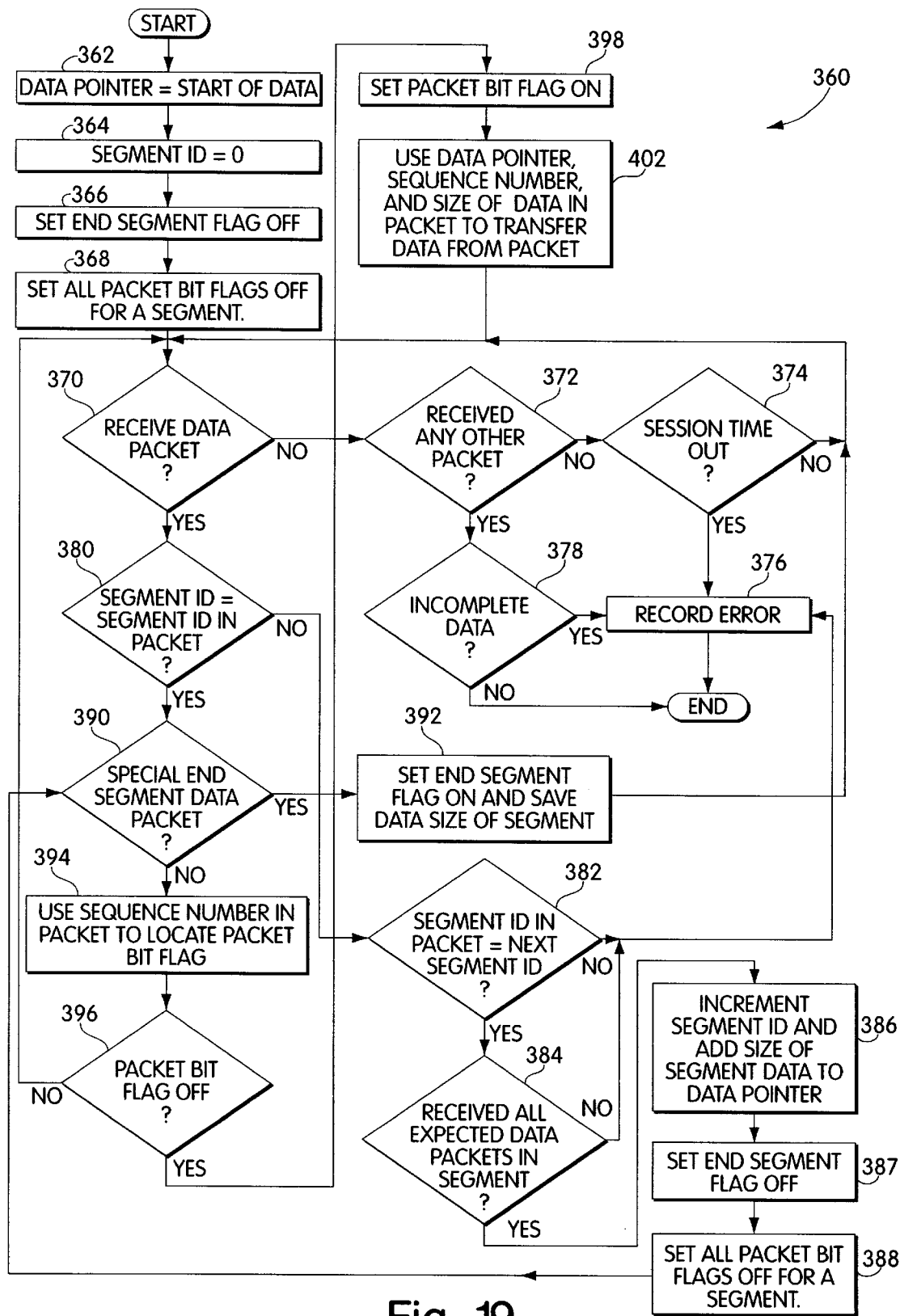
FIG. 19 is a flow chart illustrating PC software for handling receipt of data.

Referring to FIG. 19, a flow chart 360 illustrates in detail the steps associated with the step 346 of the flow chart 330 of FIG. 18 for receiving data. Processing begins at a first step 362 where a data pointer is set to the beginning of the location where the received data will be stored. Following the step 362 is a step 364 where a segment ID is set to zero. Following the step 364 is a step 366 where the end segment flag is set to OFF. Following the step 366 is a step 368 where all of the packet bit flags for the entire segment are set to OFF. The packet bit flags are used to indicate receipt of a particular packet within a segment. As discussed above, each packet has a sequence number associated therewith. Accordingly, each packet bit flag for a segment is accessed using the sequence number as an index. A segment has been completely received when all of the packet bit flags for the segment indicate that all of the packets for the segment have been received.

Following the step 368 is a test step 370 which determines if a packet of data has been received. If no packet has been received, then control transfers from the step 370 to a test step 372 to determine if the software has received any other type of packet. Note that, as discussed above in connection with the transmitter, in addition to data packets, it is possible to have other types of packets such as start of session packet or end of session packet. Once a non-data packet has been received, then presumably all of the data packets of the segment have been transmitted at least once and perhaps more than once depending on the value of the limit variable, discussed above in connection with the transmitter.

If it is determined at the test step 372 that the software has not received another type of packet, then control transfers from the step 372 to a test step 374 to determine if the session has timed out. Just as with the timeouts discussed about in connection with FIG. 18, the time required for a session timeout is a design choice that varies according to a variety of functional factors familiar to one of ordinary skill in the art. If it is determined at the test step 374 that the session has not timed out, then control transfers from the test step 374 back to the test step 370 to determine if a data packet has been received.

If it is determined at the test step 374 that there is a session timeout, then control transfers from the step 374 to a step 376 where an error is recorded. Recording an error at the step 376 indicates that not all the data has been received for the segment. If the step 376 is executed, then the result of the test at the step 348 in FIG. 18 will be that not all the data has been received. Processing is complete following the step 376.

If at the test step 372 it is determined that a packet other than a data packet has been received, then control passes from the test step 372 to a test step 378 where it is determined whether all of the data for the segment has been received. If it is determined that the data is not incomplete, that is all of the data for the segment has been received, then processing is complete after execution of the step 378. Note that, based on other control information, incomplete data may also indicate a missing segment. Otherwise, if it is determined at the step 378 that the data received for the segment is incomplete (i.e., at least one of the packets for the segment is missing), then control transfers from the step 378 to the step 376 where the error is recorded, as discussed above.

If it is determined at the test step 370 that a data packet has been received, then control transfers from the step 370 to a test step 380 where the segment ID of the packet is compared to the current value of the segment ID. The software keeps track of the current segment ID and expects each data packet to contain a segment ID equal to the expected segment ID. If it is determined at the step 380 that the segment ID in the packet does not equal the current segment ID, then control transfers from the step 380 to a test step 382 which determines if the segment ID in the packet equals the next expected segment ID. It is possible for the receiver to not have received the end of segment indication from the transmitter (due to garbled transmission), but still be able to recover by noticing that the segment IDs in the receive packets correspond to the expected next value of segment ID (i.e., one greater than the previous segment ID.

If it is determined at the test step 382 that the segment ID does not equal the next expected segment ID, then control transfers from the step 382 back to the step 376 where the error is recorded, as discussed above. Otherwise, if it is determined at the step 382 that the segment ID of the packet equals the next expected segment ID, then control transfers from the step 382 to a test step 384 which determines if all of the expected data in the previous segment was received. If not, then the previous segment is incomplete, an error has occurred, and control transfers from the test step 384 back to the step 376 where an error is recorded, as discussed above.

If it is determined at the test step 384 that all of the expected data for the previous segment was received, then control transfers from the step 384 to a step 386 where the current segment ID and data pointer are both incremented in order get ready to receive data from the next segment. Following the step 386 is a step 387 where the end segment flag is set to OFF. Following the step 387 is a step 388 where all the packet bit flags for the new segment are set to OFF. Following the step 388, control transfers to a step 390, discussed below.

If it is determined at the test step 380 that the segment ID in the packet matches the current segment ID expected by the software, then control transfers from the step 380 to the test step 390 which determines if the received segment is a special end segment data packet. An end segment data packet is a data packet that indicates the end of a segment. If it is determined at the test step 390 that the received packet is a special end segment data packet, then control transfers from the step 390 to a step 392 where the end segment flag is set to ON indicating that the end of the segment has been reached. In addition, the data size is saved at the step 392. The data size of the segment corresponds to the number of data packets that were received between the beginning of the segment and the end of the segment. Following the step 392, control transfers back to the test step 370 to wait for another data packet. The end segment packet may not be necessary if the size of the segment is provided by other means.

If at the step 390 it is determined that the received packet is not a special end segment data packet, then control transfers from the step 390 to a step 394 where the sequence number is used to index the array of packet flag bits to examine the specific packet flag bit corresponding to the sequence number of the received packet. Following the step 394 control transfers to a test step 396 which determines if the packet bit flag corresponding to the sequence number of the received packet is off, indicating that a packet having that sequence number has not been received for the segment. If the packet flag bit is not off, then a packet identical to the received packet was already received during a previous transmission of the same segment and therefore the received data does not need to be stored. Following the test step 396 control transfers back to the test step 370 to wait for receipt of the next packet. Note that using the sequence number in this manner allows receipt of packets in any order.

If it is determined at the test step 396 that the packet bit flag corresponding to the sequence number of the receipt packet is off, then control transfers from the step 396 to a step 398 where the packet bit flag is set to ON indicating receipt of the packet. Following the step 398 is a step 402 where the data pointer, sequence number, and data size parameters are used to store the received data. Following the step 402, control transfers back to the test step 370 to await receipt of the next packet.

Figure 20:
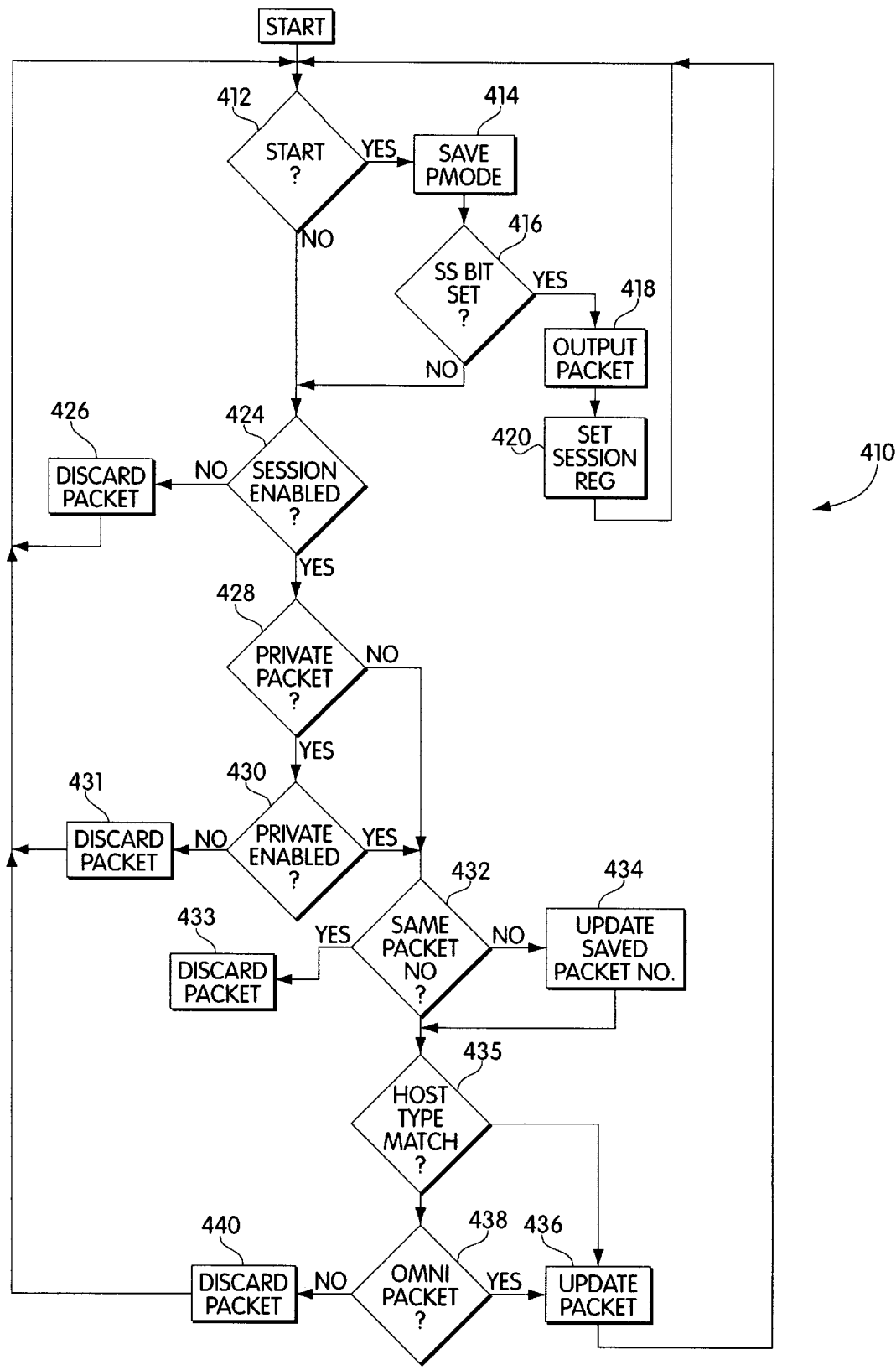
FIG. 20 is a flow chart illustrating operation of a state machine used to implement a FIFO Gate of the receiver.

Referring to FIG. 20, a flow chart 410 illustrates operation of the FIFO Gate 176 shown in FIG. 9. The FIFO Gate 176 is implemented as a state machine in a conventional manner using conventional circuitry. Therefore, the flow chart 410 is used to illustrate operation of the state machine. Note that it is straightforward to one of ordinary skill in the art to construct a circuit state machine based on a description of the inputs and outputs and a flow chart illustrating the different operations performed by the state machine.

Processing begins at a first test step 412 where the state machine determines if a start of header series of packets have been received. The state machine determines that the packet header bytes, discussed above in connection with FIG. 5, have been received. The state machine determines at the step 412 that the packet header bytes have been received by examining each byte sequentially for the fixed values contained in the start of packet header which, as discussed above in connection with FIG. 5, are 97h, D2h, 3Ah, and 6xh. If the start of packet header has been received, then control transfers from the step 412 to a step 414 where the PMODE portion of the packet header, discussed above in connection with FIG. 5, is saved. The PMODE indicates the type of packet that is received.

Following the step 414 is a test step 416 which determines if the start session bit or the packet header has been set. As discussed above, the start session bit indicates whether or not a packet represents the beginning of a new session of data. If the start session bit is set, control transfers from the step 416 to a step 418 where the packet is output by the packet FIFO Gate 176. Outputting a packet at the step 418 includes asserting the start packet signal to alert the packet FIFO 178 that a new packet of data, and hence new CRC values, is being provided. Following the step 418 is a step 420 where the one-bit register 177 shown on FIG. 9 that is used to indicate the SESSION ENABLE state is set. Note that even if the previous session was disabled the receipt of a start session bit by the packet FIFO Gate 176 causes the SESSION ENABLE bit register 177 to be set. The PC 162 can examine the data for the new session and determine whether to disable the new session by clearing the bit and the SESSION ENABLE register 177. Following the step 420, control returns back to the step 412 to wait for another start of packet header.

If it is determined at the step 412 that a start of packet header has not been received, thus indicating that regular packet data has been received, then control transfers from the step 412 to a test step 424 which determines if the SESSION ENABLED input signal is set. If the SESSION ENABLED input signal to the FIFO Gate 176 is not set, then control transfers from the step 424 to a step 426 where the received packet is discarded. Following the step 426 control transfers back to the test step 412 to wait for receipt of another packet.

If it is determined at the test step 424 that the session is enabled, then control transfers from the step 424 to a step 428 which determines if the receive packet is a private packet. As discussed above, the value of PMODE in the packet header indicates whether the packet is a private packet.

If it is determined at the test step 428 that the receive packet is a private packet, then control transfers from the test step 428 to a test step 430 which determines if the PRIVATE MODE ENABLE input signal to the FIFO Gate 176 is asserted. As discussed above, the PRIVATE MODE ENABLE signal is asserted whenever the transmitter has transmitted an encrypted version of the board ID of the receiver to the receiver.

If it is determined at the step 430 that the PRIVATE ENABLED signal is not asserted, then control passes from the step 430 to a step 431 where the packet is discarded. The packet is discarded at the step 431 if the transmitted packet is a private packet and the PRIVATE ENABLED signal is not asserted for the receiver.

If it is determined at the step 428 that the transmitted packet is not a private packet, or if it is determined at the step 430 that although the transmitted packet is a private packet, the private packet enabled signal is asserted, then control transfers from the step 428 or the step 430 to a test step 432 which determines if the packet number, from the packet header, equals the packet number of the most previously-transmitted packet. If so, then the packet is redundant and does not need to be received or processed. Accordingly, if it is determined at the test step 432 that the packet number equals the packet number of the most recently transmitted packet, control transfers to a step 433 where the packet is discarded. Following the step 433, control transfers back to the step 412 to wait for the next packet.

If it is determined at the step 432 that the same packet number has not been transmitted, control transfers to the step 434 where the packet number of the received packet is saved for comparison during the next iteration. Following the step 434 is a test step 435 which determines if there is a host type match between the host of the receiver and the host field of the transmitted packet. It is possible for the transmitter to direct packets to specific types of hosts. For example, the transmitter could direct packets to only Macintosh hosts or could direct packets to only PC/MS-DOS compatible hosts. Therefore, at the step 435 it is determined if the type of host of the receiver matches the requested host, if any, of the transmitter. If so, then control transfers from the step 435 to a step 436 where the packet is output by the packet FIFO Gate 176 to the packet FIFO 178. Note that as discussed above in connection with the step 418, outputting the packet at the step 436 includes asserting the start packet signal so that the packet FIFO can properly calculate the CRC.

If it is determined at the step 435 that the host types of the transmitted packet does not match the host type of the receiver, then control transfers from the step 434 to a step 438 which determines if the transmitted packet is an OMNI-type packet. It is possible for the transmitter to transmit packets that are readable and usable by any type of host. The transmitter can indicate that this is the case by setting an OMNI field in the transmitted data indicating that the data is readable and usable by any type of host. If it is determined at the test step 438 at the packet that is being sent as an OMNI packet, then control transfers from the step 438 to the step 436 where the packet is output, as discussed above. Otherwise, if it is determined at the step 438 that the packet is not an OMNI packet, then control transfers from the test step 438 to a step 440 where the packet is discarded. Following discarding the packet at the step 440, control transfers back to the step 412 to wait for the next start of packet.

Figure 21:
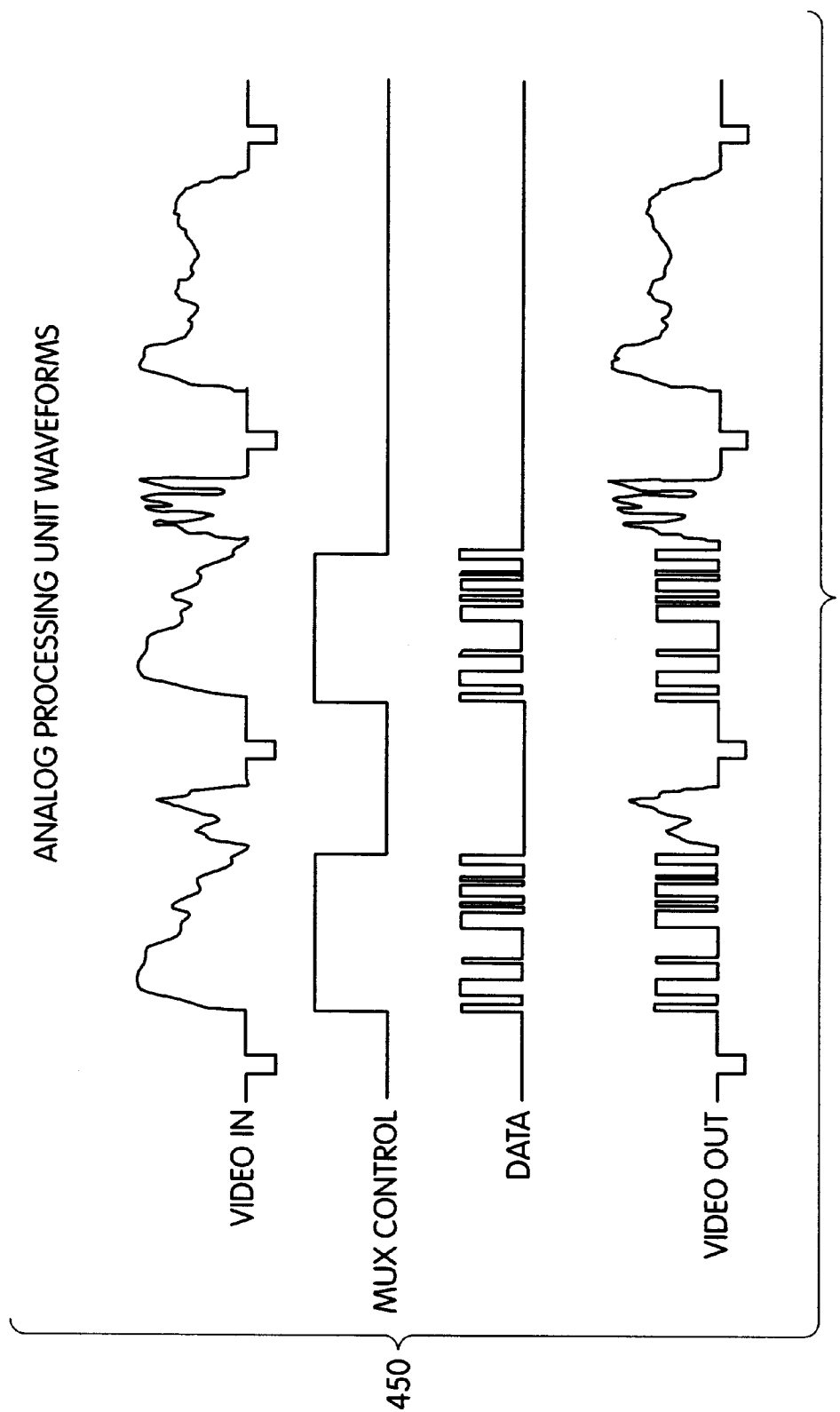
FIG. 21 is a graph illustrating superimposing data onto a video signal.

Referring to FIG. 21, a graph 450 illustrates the effect of superimposing digital data onto the video signal. The top waveform of the graph shows the input analog signal. The second and third lines of the graph show the mux control and data signals that are output by the signal processor 68 of the transmitter 32. The fourth waveform shows the effect of superimposing the data signal (the third waveform) onto the video signal (the first waveform).

Referring to FIG. 22, a graph 460 illustrates receipt of the video waveform and the result of separating the data and sync information out of the received analog video waveform. The first or top waveform shows the received analog video signal. The higher of the two dotted lines shows the threshold used to convert the input analog signal to a digital signal. The second or lower of the two dotted lines shows the signal level used to convert the input analog signal into the digitized separated sync signal. The second of the two waveforms shows the effect of digitization of the analog video waveform using the data threshold shown on the first waveform. The second waveform is high whenever the data from the first waveform is above the data threshold and is low whenever the data from the first waveform is below the data threshold.

The third waveform shows the effect of digitizing the analog video input signal using the sync threshold shown in the first waveform. The digitized separated sync is low whenever the analog video signal is below the sync threshold and is high whenever the analog video signal is above the sync threshold.

Although the invention has been illustrated herein using PC's 42, 162, it will be appreciated by one of ordinary skill in the art that the invention may be practiced using any other type of host computer or computing device including a Macintosh, a computer workstation, a mainframe or mini computer, or any other type of computing device capable of providing the necessary functionality, as illustrated herein. Similarly, although the invention has been illustrated herein using an ISA bus, it will be appreciated by one of ordinary skill in the art that the invention may be practiced using any type of connection between the signal processing unit (which may or may not be an ASIC chip as illustrated herein) and the PC or other host computer.

While the invention has been disclosed in connection with the preferred embodiments shown and described in detail, various modifications and improvements thereon will become readily apparent to those skilled in the art. Accordingly, the spirit and scope of the present invention is to be limited only by the following claims.

What is claimed is:

1. A method of transmitting data to a plurality of receivers, the method comprising the steps of:
   (a) assigning a board identifier to each of the receivers wherein, once assigned, the board identifier cannot be ascertained by observation of the receiver;
   (b) selecting a subset of receivers to receive the data;
   (c) transmitting an encrypted board identifier packet corresponding to each receiver of the subset, wherein a receiver of the subset becomes enabled upon receipt of a corresponding encrypted board identifier; and
   (d) transmitting the data with an indication that the data is only for receivers that have been enabled, wherein each of the receivers that is enabled receives the data.

2. A method of transmitting data to a plurality of receivers, according to claim 1, wherein the data is encrypted before transmission.

3. A method of transmitting data to a plurality of receivers, according to claim 2, wherein the board ID's and the data are encrypted using different encryption techniques.

4. A method of transmitting data to a plurality of receivers, according to claim 3, wherein the data is encrypted using a DES encryption technique.

5. A method of transmitting data to a plurality of receivers, according to claim 1, wherein the board ID is encrypted using an ECB DES encryption technique.

6. A method of transmitting data to a plurality of receivers, according to claim 1, wherein only the receivers that are enabled can receive the data.

7. A method of transmitting data to a plurality of receivers, according to claim 1, wherein the step of assigning a board ID includes assigning a unique board ID to each of the receivers.

8. A method of transmitting data to a plurality of receivers, according to claim 1, wherein data is transmitted in packets.

9. A method of transmitting data to a plurality of receivers, according to claim 8, wherein a plurality of board ID's are transmitted in a single packet.

10. A method of transmitting data to a plurality of receivers, according to claim 1, wherein a board ID that has been assigned cannot be modified.

11. A method of transmitting data to a plurality of receivers, according to claim 1, wherein data is transmitted by being superimposed onto a video signal.

12. A method of transmitting data to a plurality of receivers using a video signal, the method comprising the steps of:
   (a) assigning a board identifier to each of the receivers wherein, once assigned, the board identifier cannot be ascertained by observation of the receiver;
   (b) selecting a subset of receivers to receive the data;
   (c) superimposing an encrypted board identifier corresponding to each receiver of the subset onto the video signal to provide a first combined signal;
   (d) transmitting the first combined signal, wherein a particular receiver of the subset becomes enabled upon receipt of a corresponding encrypted board identifier for the particular receiver;
   (e) superimposing the data onto the video signal to provide a second combined signal; and
   (f) transmitting the second combined signal along with an indication that the data contained in the second combined signal is only for receivers that have been enabled, wherein each of the receivers that is enabled receives the data.

13. A method of transmitting data to a plurality of receivers using a video signal, according to claim 12, further comprising the step of:
   (g) encrypting the data prior to superimposing the data onto the video signal.

14. A method of transmitting data to a plurality of receivers using a video signal, according to claim 13, wherein each board ID is encrypted using a different encryption technique than that used to encrypt the data.

15. A method of transmitting data to a plurality of receivers using a video signal, according to claim 14, wherein the data is encrypted using a DES encryption technique.

16. A method of transmitting data to a plurality of receivers using a video signal, according to claim 12, wherein each board ID is encrypted using an ECB DES encryption technique.

17. A method of transmitting data to a plurality of receivers using a video signal, according to claim 12, wherein only the receivers that are enabled receive the data.

18. A method of transmitting data to a plurality of receivers using a video signal, according to claim 12, wherein the step of assigning a board ID includes assigning a unique board ID to each of the receivers.

19. A method of transmitting data to a plurality of receivers using a video signal, according to claim 12, wherein the data is transmitted in packets.

20. A method of transmitting data to a plurality of receivers using a video signal, according to claim 19, wherein a plurality of board ID's are transmitted in a single packet.

21. A method of transmitting data to a plurality of receivers using a video signal, according to claim 12, wherein a board ID that has been assigned cannot be modified.

22. A device for transmitting data to a plurality of receivers, the device comprising:
   (a) means for assigning a board identifier to each of a plurality of receivers wherein, once assigned, the board identifier cannot be ascertained by observation of the receiver;
   (b) transmitter, for transmitting an encrypted board identifier corresponding to each receiver of a subset of the receivers, wherein a receiver of the subset becomes enabled upon receipt of a corresponding encrypted board identifier; and
   (c) a signal processor for transmitting with the data an indication that the data is only for receivers that have been enabled, wherein each of the receivers that is enabled receives the data.

23. A device for transmitting data to a plurality of receivers, according to claim 22, wherein the device further comprises means for encrypting the data prior to transmission.

24. A device for transmitting data to a plurality of receivers, according to claim 22, wherein only the receivers that are enabled can receive the data.

25. A device for transmitting data to a plurality of receivers, according to claim 22, wherein the means for assigning a board ID includes means for assigning a unique board ID to each of the receivers.

26. A device for transmitting data to a plurality of receivers, according to claim 22, wherein a board ID that has been assigned cannot be modified.

27. A device for transmitting data to a plurality of receivers, according to claim 22, wherein data is transmitted by being superimposed onto a video signal.

28. A device for transmitting data to a plurality of receivers, the device comprising:
   (a) means for assigning a board identifier to each of the receivers wherein, once assigned, the board identifier cannot be ascertained by observation of the receiver;
   (b) means for selecting a subset of receivers to receive the data;
   (c) means for encrypting board identifiers of the subset of receivers to provide a plurality of encrypted board identifiers;
   (d) means for superimposing the encrypted board identifiers onto a video signal to provide a first combined signal;
   (e) means for transmitting the first combined signal, wherein a receiver of the subset becomes enabled upon receipt of a corresponding encrypted board identifier;

(f) means for superimposing the data onto the video signal to provide a second combined signal; and
(g) means for transmitting the second combined signal with an indication that the data is only for receivers that have been enabled, wherein each of the receivers that is enabled receives the data.

* * * * *